US010840284B2

(12) United States Patent
Ennoji et al.

(10) Patent No.: US 10,840,284 B2
(45) Date of Patent: Nov. 17, 2020

(54) IMAGING ELEMENT WITH A FIRST AND SECOND CONVERGING PORTION FOR CONVERGING LIGHT BETWEEN A FIRST AND SECOND SIGNAL EXTRACTION PORTION OF ADJACENT PIXELS

(71) Applicant: SONY SEMICONDUCTOR SOLUTIONS CORPORATION, Kanagawa (JP)

(72) Inventors: Kohei Ennoji, Kumamoto (JP); Shingo Yamaguchi, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/349,745

(22) PCT Filed: Sep. 14, 2018

(86) PCT No.: PCT/JP2018/034110
§ 371 (c)(1),
(2) Date: May 14, 2019

(87) PCT Pub. No.: WO2019/065291
PCT Pub. Date: Apr. 4, 2019

(65) Prior Publication Data
US 2020/0219921 A1 Jul. 9, 2020

(30) Foreign Application Priority Data

Sep. 28, 2017 (JP) .................................. 2017-188152

(51) Int. Cl.
*H01L 27/146* (2006.01)
*G01S 17/08* (2006.01)

(52) U.S. Cl.
CPC .. *H01L 27/14627* (2013.01); *H01L 27/14623* (2013.01); *H01L 27/14649* (2013.01); *G01S 17/08* (2013.01)

(58) Field of Classification Search
CPC ......... H01L 27/14623; H01L 27/14627; H01L 27/14649
See application file for complete search history.

(56) References Cited

U.S. PATENT DOCUMENTS 9,117,712 B1    8/2015  Oggier et al.
9,912,828 B2 *  3/2018  Sano ....................... H04N 1/031
(Continued)

FOREIGN PATENT DOCUMENTS

JP    H04-82269      3/1992
JP    2010-098066    4/2010
(Continued)

OTHER PUBLICATIONS

International Search Report prepared by the Japan Patent Office dated Oct. 31, 2018, for International Application No. PCT/JP2018/034110.

(Continued)

*Primary Examiner* — Andrew Q Tran
(74) *Attorney, Agent, or Firm* — Sheridan Ross P.C.

(57) ABSTRACT

The present technology relates to an imaging element and an imaging device that enables reduction of a distance measurement error. The device includes a pixel array unit including a plurality of pixels that performs photoelectric conversion of light, in which each includes: a substrate that performs photoelectric conversion of the light; a first signal extraction portion including an application electrode to generate an electric field by application of a voltage and an attraction electrode to detect a signal carrier generated by photoelectric conversion; a second signal extraction portion
(Continued)

including the application electrode and the attraction electrode; and a converging portion that is formed on the substrate and causes the light to enter the substrate. The converging portion converges the light at least between the first signal extraction portion and the second signal extraction portion provided in the substrate. The present technology can be applied to a CAPD sensor.

11 Claims, 28 Drawing Sheets

(56) References Cited

U.S. PATENT DOCUMENTS

| | | | |
|---|---|---|---|
| 10,686,004 B2* | 6/2020 | Kato | H01L 27/1464 |
| 2006/0006438 A1 | 1/2006 | Maruyama | |
| 2009/0090937 A1 | 4/2009 | Park | |
| 2010/0091168 A1 | 4/2010 | Igarashi et al. | |
| 2011/0199602 A1 | 8/2011 | Kim et al. | |
| 2012/0086093 A1 | 4/2012 | Otsuka et al. | |
| 2013/0193546 A1 | 8/2013 | Webster et al. | |
| 2015/0035104 A1 | 2/2015 | Horikoshi | |
| 2017/0194367 A1 | 7/2017 | Fotopoulou et al. | |
| 2017/0229503 A1 | 8/2017 | Suzuki et al. | |
| 2018/0054581 A1 | 2/2018 | Sano et al. | |

FOREIGN PATENT DOCUMENTS

| | | |
|---|---|---|
| JP | 2011-061239 | 3/2011 |
| JP | 2011-171715 | 9/2011 |
| JP | 2012-084608 | 4/2012 |
| JP | 2015-028960 | 2/2015 |
| JP | 2015-029011 | 2/2015 |
| JP | 2017-134265 | 8/2017 |
| JP | 2017-522727 | 8/2017 |
| JP | 2017-163010 | 9/2017 |
| WO | WO 2017/121820 | 7/2017 |
| WO | WO 2017/150391 | 9/2017 |
| WO | WO 2016/167044 | 2/2018 |
| WO | WO 2018/135320 | 7/2018 |

OTHER PUBLICATIONS

Extended European Search Report for European Patent Application No. 18861389.7, dated Mar. 10, 2020, 6 pages.

* cited by examiner

IMAGING ELEMENT WITH A FIRST AND SECOND CONVERGING PORTION FOR CONVERGING LIGHT BETWEEN A FIRST AND SECOND SIGNAL EXTRACTION PORTION OF ADJACENT PIXELS

CROSS REFERENCE TO RELATED APPLICATIONS

This application is a national stage application under 35 U.S.C. 371 and claims the benefit of PCT Application No. PCT/JP2018/034110 having an international filing date of 14 Sep. 2018, which designated the United States, which PCT application claimed the benefit of Japanese Patent Application No. 2017-188152 filed 28 Sep. 2017, the entire disclosures of each of which are incorporated herein by reference.

TECHNICAL FIELD

The present technology relates to an imaging element and an imaging device, and in particular to an imaging element and an imaging device that enables reduction of a distance measurement error.

BACKGROUND ART

A distance measurement system using an indirect Time of Flight (ToF) method is conventionally known. In such a distance measurement system, a sensor is essential that can distribute signal charges to different regions at high speed, the signal charges being obtained by receiving reflected light of active light hitting on an object, the active light being emitted by using a light emitting diode (LED) or a laser at a certain phase.

A technology has therefore been devised in which, for example, a voltage is directly applied to a substrate of a sensor to generate a current in the substrate, whereby modulation can be performed at high speed in a region of a wide range in the substrate (see, for example, Patent Document 1). Such a sensor is also called a Current Assisted Photonic Demodulator (CAPD) sensor.

In the CAPD sensor, in a substrate constituting a pixel, a pair of signal extraction portions (Taps) is provided each having an application electrode to which a voltage is applied and an attraction electrode for collecting electric charges. When a voltage is applied to the application electrode of one Tap (referred to as Active Tap), an electric field is generated between the application electrodes of the two Taps, and the signal charges generated by photoelectric conversion in the substrate are conducted to the attraction electrode of the Active Tap.

CITATION LIST

Patent Document

Patent Document 1: Japanese Patent Application Laid-Open No. 2011-86904

SUMMARY OF THE INVENTION

Problems to be Solved by the Invention

Here, among the signal charges generated by photoelectric conversion, a ratio of the signal charges conducted to the Active Tap is referred to as transfer efficiency. As the transfer efficiency increases, pixel sensitivity increases, and the distance measurement error can be reduced.

However, since the pixel of the conventional CAPD sensor is not provided with a converging structure that converges light, photoelectric conversion has been performed on the entire surface of the pixel (substrate). Therefore, a possibility is increased that the signal charges generated by photoelectric conversion are conducted to the attraction electrode of a Tap (inactive Tap) that is not the Active Tap. As a result, there has been a possibility that the transfer efficiency decreases and the distance measurement error increases.

The present technology has been made in view of such a situation, and it is intended to reduce the distance measurement error.

Solutions to Problems

An imaging element of a first aspect of the present technology includes a pixel array unit including a plurality of pixels that performs photoelectric conversion of light having entered, in which each of the pixels includes: a substrate that performs photoelectric conversion of the light having entered; a first signal extraction portion including an application electrode to generate an electric field by application of a voltage and an attraction electrode to detect a signal carrier generated by photoelectric conversion; a second signal extraction portion including the application electrode and the attraction electrode; and a converging portion that is formed on the substrate and causes the light to enter the substrate, and the converging portion converges the light at least between the first signal extraction portion and the second signal extraction portion provided in the substrate.

An imaging device of a first aspect of the present technology includes an imaging element including a pixel array unit including a plurality of pixels that performs photoelectric conversion of light having entered, in which each of the pixels includes: a substrate that performs photoelectric conversion of the light having entered; a first signal extraction portion including an application electrode to generate an electric field by application of a voltage and an attraction electrode to detect a signal carrier generated by photoelectric conversion; a second signal extraction portion including the application electrode and the attraction electrode; and a converging portion that is formed on the substrate and causes the light to enter the substrate, and the converging portion converges the light at least between the first signal extraction portion and the second signal extraction portion provided in the substrate.

In the first aspect of the present technology, in each of the pixels including: the substrate that performs photoelectric conversion of the light having entered; the first signal extraction portion including the application electrode to generate the electric field by application of the voltage and the attraction electrode to detect the signal carrier generated by photoelectric conversion; the second signal extraction portion including the application electrode and the attraction electrode; and the converging portion that is formed on the substrate and causes the light to enter the substrate, the light is converged at least between the first signal extraction portion and the second signal extraction portion provided in the substrate.

An imaging element of a second aspect of the present technology includes a pixel array unit including a plurality of pixels that performs photoelectric conversion of light having entered, in which each of the pixels includes: a substrate that performs photoelectric conversion of the light having entered; a first application electrode and a second application electrode to generate an electric field by application of a voltage and a first attraction electrode and a second attraction electrode to detect a signal carrier generated by photoelectric conversion; a converging portion that is formed on the substrate and causes the light to enter the substrate; and a light shielding portion formed on the substrate, a center of the converging portion is arranged between the first application electrode and the second application electrode in a plan view, and an end of the converging portion overlaps the light shielding portion in the plan view.

In the second aspect of the present technology, in each of the pixels including: the substrate that performs photoelectric conversion of the light having entered; the first application electrode and the second application electrode to generate the electric field by application of the voltage and the first attraction electrode and the second attraction electrode to detect the signal carrier generated by photoelectric conversion; the converging portion that is formed on the substrate and causes the light to enter the substrate; and the light shielding portion formed on the substrate, the center of the converging portion is arranged between the first application electrode and the second application electrode in the plan view, and the end of the converging portion overlaps the light shielding portion in the plan view.

An imaging element of a third aspect of the present technology includes a pixel array unit including a first pixel and a second pixel that perform photoelectric conversion of light having entered, the first pixel being arranged at a position closer to a center of the pixel array unit than the second pixel, in which the first pixel includes: a first application electrode and a second application electrode to generate an electric field in a substrate by application of a voltage; a first attraction electrode and a second attraction electrode to detect a signal carrier generated by photoelectric conversion; and a first converging portion that is formed on the substrate and causes the light to enter the substrate, the second pixel includes: a third application electrode and a fourth application electrode to generate an electric field in the substrate by application of a voltage; a third attraction electrode and a fourth attraction electrode to detect a signal carrier generated by photoelectric conversion; and a second converging portion that is formed on the substrate and causes the light to enter the substrate, a center of the first converging portion is arranged at an intermediate position between the first application electrode and the second application electrode in a plan view, and a center of the second converging portion is arranged at a position shifted from an intermediate position between the third application electrode and the fourth application electrode in the plan view.

In the third aspect of the present technology, the first pixel is arranged at the position closer to the center of the pixel array unit than the second pixel, in which in the first pixel including: the first application electrode and the second application electrode to generate the electric field in the substrate by application of the voltage; the first attraction electrode and the second attraction electrode to detect the signal carrier generated by photoelectric conversion; and the first converging portion that is formed on the substrate and causes the light to enter the substrate, the center of the first converging portion is arranged at the intermediate position between the first application electrode and the second application electrode in the plan view, and in the second pixel including: the third application electrode and the fourth application electrode to generate the electric field in the substrate by application of the voltage; the third attraction electrode and the fourth attraction electrode to detect the signal carrier generated by photoelectric conversion; and the second converging portion that is formed on the substrate and causes the light to enter the substrate, the center of the second converging portion is arranged at the position shifted from the intermediate position between the third application electrode and the fourth application electrode in the plan view.

Effects of the Invention

According to the present technology, the distance measurement error can be reduced.

Note that, the effect described here is not necessarily limited, and can be any effect described in the present disclosure.

MODE FOR CARRYING OUT THE INVENTION

Figure 1:
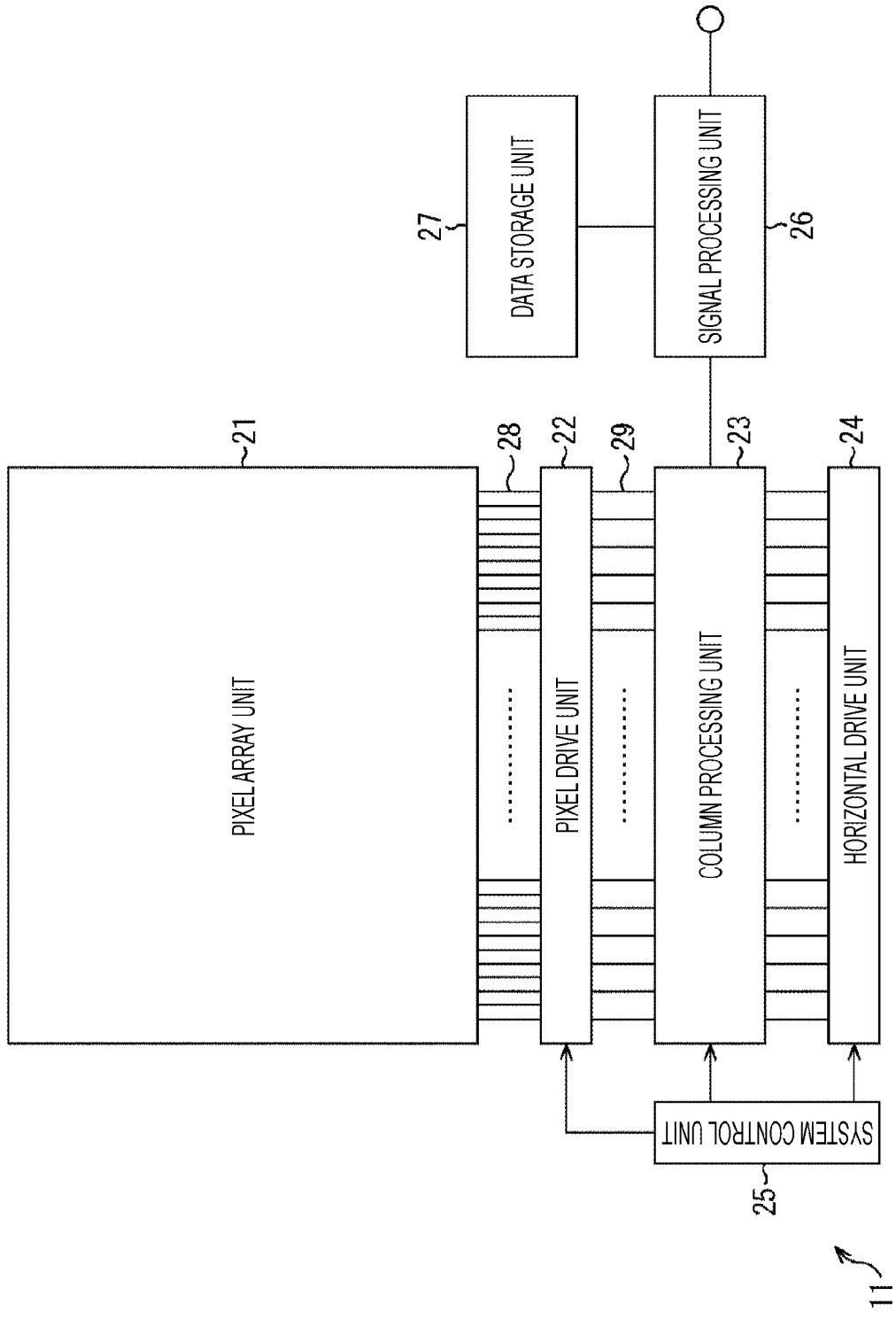
FIG. 1 is a diagram illustrating a configuration example of a solid-state imaging element.

The following is a description of a mode for carrying out the present disclosure (the mode will be hereinafter referred to as the embodiment). Note that, description will be made in the following order.

1. Configuration example of solid-state imaging element
2. First embodiment (configuration for converging light at center of pixel)
3. Variation of converging portion
4. Variation of pixel separation portion
5. Other variations
6. Second embodiment (configuration for converging light between Taps)
7. Applicable CAPD sensor
8. Configuration example of imaging device
9. Application example to mobile body The present technology can be applied to, for example, a solid-state imaging element constituting a distance measurement system that performs distance measurement by an indirect ToF method, an imaging device including such a solid-state imaging element, and the like.

The distance measurement system can be applied to a vehicle-mounted system that is mounted on a vehicle and measures a distance to an object outside the vehicle, a gesture recognition system that measures a distance to an object such as a user's hand and recognizes a user's gesture on the basis of the measurement result, and the like. In this case, a result of gesture recognition can be used for operation of a car navigation system, or the like, for example.

1. Configuration Example of Solid-State Imaging Element

FIG. 1 is a diagram illustrating a configuration example of an embodiment of a solid-state imaging element to which the present technology is applied.

A solid-state imaging element 11 illustrated in FIG. 1 is a back-illuminated CAPD sensor and is provided in an imaging device having a distance measurement function.

The solid-state imaging element 11 includes a pixel array unit 21 formed on a semiconductor substrate (not illustrated) and a peripheral circuit unit integrated on the same semiconductor substrate as that on which the pixel array unit 21 is formed. The peripheral circuit unit includes, for example, a pixel drive unit 22, a column processing unit 23, a horizontal drive unit 24, and a system control unit 25.

The solid-state imaging element 11 is further provided with a signal processing unit 26 and a data storage unit 27. The signal processing unit 26 and the data storage unit 27 may be mounted on the same substrate as that of the solid-state imaging element 11, or may be arranged on a substrate different from that of the solid-state imaging element 11 in the imaging device.

The pixel array unit 21 includes unit pixels (hereinafter simply referred to as pixels) two-dimensionally arranged in a row direction and a column direction, in other words, in a matrix, the pixels each generating electric charges corresponding to an amount of light received and outputting a signal corresponding to the electric charges. In other words, the pixel array unit 21 includes a plurality of the pixels each performing photoelectric conversion of light having entered and outputting the signal corresponding to the electric charges obtained as a result of the photoelectric conversion.

Here, the row direction refers to an arrangement direction of the pixels of pixel rows (in other words, the horizontal direction), and the column direction refers to an arrangement direction of the pixels of pixel columns (in other words, the vertical direction). That is, the row direction is the horizontal direction in the figure, and the column direction is the vertical direction in the figure.

In the pixel array unit 21, a pixel drive line 28 and a vertical signal line 29 are wired along the column direction for each pixel column with respect to the pixel arrangement in the matrix.

For example, the pixel drive line 28 transmits a drive signal for driving for reading a signal from a pixel, and the like. Note that, in FIG. 1, the pixel drive line 28 is illustrated as one wiring line, but a plurality of pixel drive lines is actually connected to one pixel. One end of the pixel drive line 28 is connected to an output end corresponding to each column of the pixel drive unit 22. Furthermore, two vertical signal lines 29 are connected to each pixel column.

The pixel drive unit 22 includes a shift register, an address decoder, and the like, and drives each pixel of the pixel array unit 21 at the same time for all pixels or on a column basis. In other words, the pixel drive unit 22, together with the system control unit 25 that controls the pixel drive unit 22, constitutes a drive unit that controls operation of each pixel of the pixel array unit 21. Note that, separately from the pixel drive unit 22, a vertical drive unit may be provided that drives the pixels of the pixel array unit 21 on a row basis.

The signal output from each pixel of the pixel columns depending on drive control by the pixel drive unit 22 is input to the column processing unit 23 through the vertical signal line 29. The column processing unit 23 performs predetermined signal processing on the signal output from each pixel through the vertical signal line 29 and temporarily holds a pixel signal after the signal processing.

Specifically, the column processing unit 23 performs noise removal processing, analog to digital (AD) conversion processing, and the like, as the signal processing.

The horizontal drive unit 24 includes a shift register, an address decoder, and the like, and sequentially selects unit circuits corresponding to the pixel columns of the column processing unit 23. By selective scanning by the horizontal drive unit 24, the pixel signal is sequentially output that is subjected to the signal processing for each unit circuit in the column processing unit 23.

The system control unit 25 includes a timing generator that generates various timing signals, and the like, and performs drive control of the pixel drive unit 22, the column processing unit 23, the horizontal drive unit 24, and the like, on the basis of the various timing signals generated by the timing generator.

The signal processing unit 26 has at least an arithmetic processing function, and performs various types of signal processing such as arithmetic processing, on the basis of the pixel signal output from the column processing unit 23. The data storage unit 27 temporarily stores data necessary for the signal processing in the signal processing unit 26.

2. First Embodiment

Configuration Example of Pixel

Figure 2:
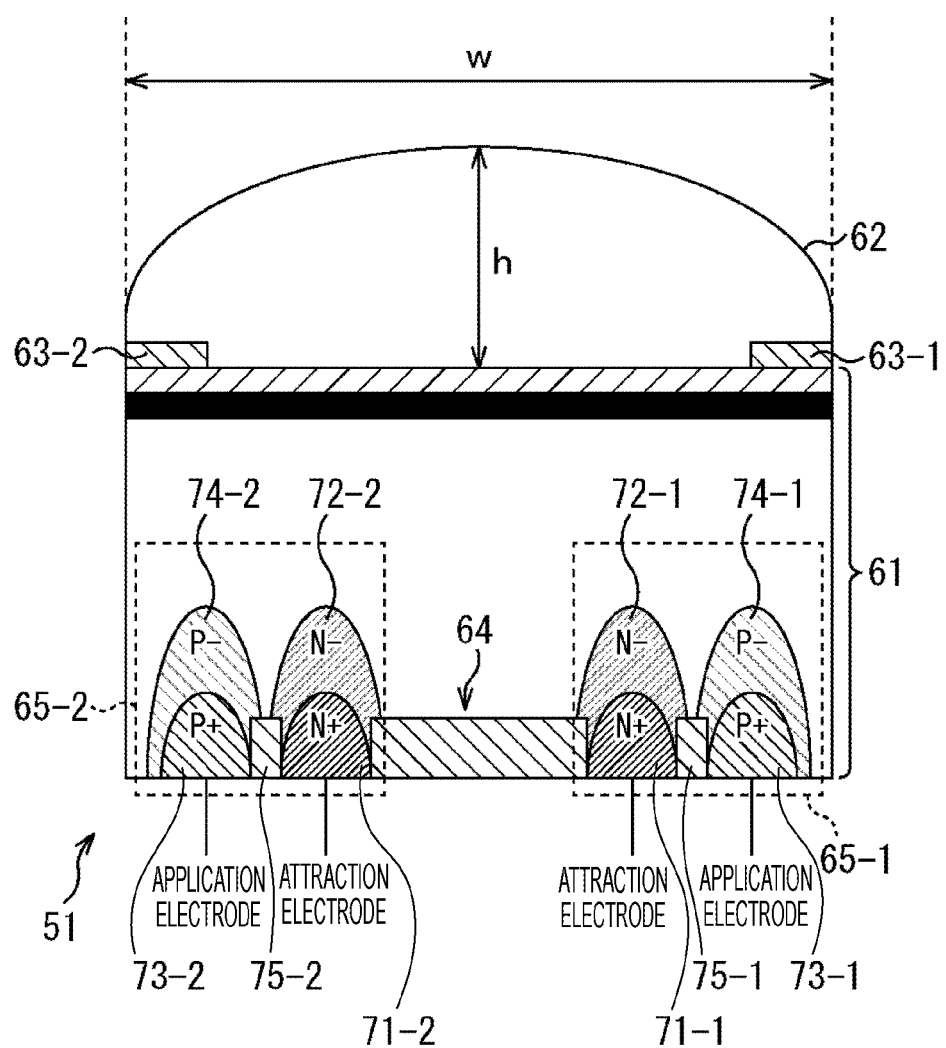
FIG. 2 is a diagram illustrating a configuration example of a pixel of a first embodiment.

FIG. 2 is a diagram illustrating a configuration example of a pixel of a first embodiment to which the present technology is applied.

FIG. 2 illustrates a cross section of one pixel 51 provided in the pixel array unit 21. The pixel 51 receives light having entered from the outside, in particular, infrared light, performs photoelectric conversion of the light received, and outputs a signal corresponding to electric charges obtained as a result of the photoelectric conversion.

The pixel 51 includes, for example, a silicon substrate, in other words, a substrate 61 that is a P-type semiconductor substrate including a P-type semiconductor region, and an on-chip lens 62 formed on the substrate 61.

The thickness of the substrate 61 is made to be, for example, less than or equal to 20 μm, in the vertical direction in the figure, that is, in a direction perpendicular to a surface of the substrate 61. Note that, the thickness of the substrate 61 may of course be greater than or equal to 20 μm, and the thickness only needs to be determined depending on targeted characteristics of the solid-state imaging element 11, and the like.

On the upper surface of the substrate 61 in the figure, that is, on a surface of the substrate 61 on a side where light from the outside enters (hereinafter also referred to as an incident surface), the on-chip lens 62 having an upwardly convex curved surface shape is formed as a converging portion that converges the light having entered from the outside and causes the light to enter in the substrate 61.

Etch back is performed on STSR that is an organic material, whereby the on-chip lens 62 is formed. A lens diameter w of the on-chip lens 62 is, for example, about 10 μm, and a thickness h of the on-chip lens 62 is, for example, greater than or equal to 4 μm.

In the pixel 51, at an end portion of the pixel 51 on the incident surface of the substrate 61, inter-pixel light shielding portions 63-1 and 63-2 are formed to prevent color mixing between adjacent pixels.

In the example of FIG. 2, light having entered the on-chip lens 62 from the outside is shielded by the inter-pixel light shielding portion 63-1 and the inter-pixel light shielding portion 63-2, and does not enter another pixel adjacent to the pixel 51. Hereinafter, in a case where it is not necessary to particularly distinguish the inter-pixel light shielding portions 63-1 and 63-2 from each other, each of them is simply referred to as an inter-pixel light shielding portion 63.

Since the solid-state imaging element 11 is the back-illuminated CAPD sensor, the incident surface of the substrate 61 is a so-called back surface, and a wiring layer including wiring lines and the like is not formed on the back surface. On the other hand, in the portion of a surface on an opposite side of the substrate 61 from the incident surface, wiring layers are formed to be layered respectively including a wiring line for driving a transistor and the like formed in the pixel 51, a wiring line for reading a signal from the pixel 51, and the like.

In a surface side on an opposite side of the substrate 61 from the incident surface, in other words, a portion inside the lower surface in the figure, an oxide film 64 and signal extraction portions 65-1 and 65-2 called Taps are formed.

In the example of FIG. 2, the oxide film 64 is formed at a central portion of the pixel 51 in the vicinity of the surface on the opposite side of the substrate 61 from the incident surface, and the signal extraction portion 65-1 and the signal extraction portion 65-2 are respectively formed at both ends of the oxide film 64.

The signal extraction portion 65-1 includes: an N+ semiconductor region 71-1 and an N− semiconductor region 72-1 that are N-type semiconductor regions; and a P+ semiconductor region 73-1 and a P− semiconductor region 74-1 that are P-type semiconductor regions.

Specifically, the N+ semiconductor region 71-1 is formed at a position adjacent to the right side in the figure of the oxide film 64, in a surface inner side portion of the surface on the opposite side of the substrate 61 from the incident surface. Furthermore, on the upper side in the figure of the N+ semiconductor region 71-1, the N− semiconductor region 72-1 is formed to cover (surround) the N+ semiconductor region 71-1.

Moreover, the P+ semiconductor region 73-1 is formed at a position adjacent to the right side in the figure of the N+ semiconductor region 71-1, in the surface inner side portion of the surface on the opposite side of the substrate 61 from the incident surface. Furthermore, on the upper side in the figure of the P+ semiconductor region 73-1, the P− semiconductor region 74-1 is formed to cover (surround) the P+ semiconductor region 73-1.

Note that, as will be described in detail later, when the substrate 61 is viewed from the direction perpendicular to the surface, the N+ semiconductor region 71-1 and the N− semiconductor region 72-1 are formed to surround the periphery of the P+ semiconductor region 73-1 and the P− semiconductor region 74-1, with the P+ semiconductor region 73-1 and the P− semiconductor region 74-1 as the center.

Similarly, the signal extraction portion 65-2 includes: an N+ semiconductor region 71-2 and an N− semiconductor region 72-2 that are N-type semiconductor regions; and a P+ semiconductor region 73-2 and a P− semiconductor region 74-2 that are P-type semiconductor regions.

Specifically, the N+ semiconductor region 71-2 is formed at a position adjacent to the left side in the figure of the oxide film 64, in the surface inner side portion of the surface on the opposite side of the substrate 61 from the incident surface. Furthermore, on the upper side in the figure of the N+ semiconductor region 71-2, the N− semiconductor region 72-2 is formed to cover (surround) the N+ semiconductor region 71-2.

Moreover, the P+ semiconductor region 73-2 is formed at a position adjacent to the left side in the figure of the N+ semiconductor region 71-2, in the surface inner side portion of the surface on the opposite side of the substrate 61 from the incident surface. Furthermore, on the upper side in the figure of the P+ semiconductor region 73-2, the P− semiconductor region 74-2 is formed to cover (surround) the P+ semiconductor region 73-2.

Note that, as will be described in detail later, when the substrate 61 is viewed from the direction perpendicular to the surface, the N+ semiconductor region 71-2 and the N− semiconductor region 72-2 are formed to surround the periphery of the P+ semiconductor region 73-2 and the P− semiconductor region 74-2, with the P+ semiconductor region 73-2 and the P− semiconductor region 74-2 as the center.

Hereinafter, in a case where it is not necessary to particularly distinguish the signal extraction portions 65-1 and 65-2 from each other, each of them is also simply referred to as a signal extraction portion 65.

Furthermore, hereinafter, in a case where it is not necessary to particularly distinguish the N+ semiconductor region 71-1 and the N+ semiconductor region 71-2 from each other, each of them is simply referred to as an N+ semiconductor region 71, and in a case where it is not necessary to particularly distinguish the N− semiconductor region 72-1 and the N− semiconductor region 72-2, each of them is simply referred to as an N− semiconductor region 72.

Similarly, in a case where it is not necessary to Particularly distinguish the P+ semiconductor region 73-1 and the P+ semiconductor region 73-2 from each other, each of them is simply referred to as a P+ semiconductor region 73, and in a case where it is not necessary to particularly distinguish the P− semiconductor region 74-1 and the P− semiconductor region 74-2 from each other, each of them is simply referred to as a P− semiconductor region 74.

Between the N+ semiconductor region 71-1 and the P+ semiconductor region 73-1, a separation portion 75-1 for separating these regions is formed including oxide film or the like. Similarly, between the N+ semiconductor region 71-2 and the P+ semiconductor region 73-2, a separation portion 75-2 for separating these regions is formed including an oxide film or the like. Hereinafter, in a case where it is not necessary to particularly distinguish the separation portions 75-1 and 75-2 from each other, each of them is simply referred to as a separation portion 75.

The N+ semiconductor region 71 provided on the substrate 61 functions as a detecting unit for detecting an amount of light having entered the pixel 51 from the outside, in other words, an amount of signal carriers generated by photoelectric conversion by the substrate 61. That is, the N+ semiconductor region 71 is constituted as an attraction electrode that collects electric charges (electrons) generated by the photoelectric conversion by the substrate 61.

Furthermore, the P+ semiconductor region 73 is constituted as an application electrode for injecting a majority carrier current into the substrate 61, in other words, for applying a voltage directly to the substrate 61 to generate an electric field in the substrate 61.

In the pixel 51, a floating diffusion (FD) portion (hereinafter referred to as an FD portion A in particular) that is a floating diffusion region (not illustrated) is directly connected to the N+ semiconductor region 71-1. The FD portion A is connected to the vertical signal line 29 via an amplifier transistor (not illustrated) and the like.

Similarly, another FD portion (hereinafter referred to as an FD portion B in particular) different from the FD portion A is directly connected to the N+ semiconductor region 71-2. The FD portion B is connected to the vertical signal line 29 via an amplifier transistor (not illustrated) and the like. Here, the FD portion A and the FD portion B are respectively connected to vertical signal lines 29 different from each other.

Distance Measurement by Indirect ToF Method

In a case where the distance to the object is measured by the indirect ToF method, infrared light is emitted toward the object from the imaging device provided with the solid-state imaging element 11. Then, when the infrared light is reflected by the object and returns to the imaging device as reflected light, the substrate 61 of the solid-state imaging element 11 receives the reflected light (infrared light) having entered and performs photoelectric conversion.

At this time, the pixel drive unit 22 drives the pixel 51, and distributes a signal corresponding to electric charges obtained by the photoelectric conversion to the FD portion A and the FD portion B.

For example, at a certain timing, the pixel drive unit 22 applies a voltage to the two P+ semiconductor regions 73 via the pixel drive line 28, a contact, and the like.

Specifically, the pixel drive unit 22 applies a positive voltage larger than 0 V to the P+ semiconductor region 73-1 via the pixel drive line 28, and applies a voltage of 0 V via the pixel drive line 28 to the P+ semiconductor region 73-2. In other words, a positive voltage is applied to the P+ semiconductor region 73-1, and no voltage is substantially applied to the P+ semiconductor region 73-2.

As described above, when a voltage is applied to the P+ semiconductor region 73, an electric field is generated between the two P+ semiconductor regions 73 in the substrate 61, and a current flows from the P+ semiconductor region 73-1 to the P+ semiconductor region 73-2. In this case, holes in the substrate 61 move in a direction toward the P+ semiconductor region 73-2, and the electrons move in a direction toward the P+ semiconductor region 73-1.

When the infrared light from the outside enters in the substrate 61 and is converted into a pair of electrons and holes by the photoelectric conversion in the substrate 61 in such a state, the obtained electrons are conducted in a direction toward the P+ semiconductor region 73-1 due to the electric field between the P+ semiconductor regions 73, and moves into the N+ semiconductor region 71-1.

At this time, the electrons generated by the photoelectric conversion are used as signal carriers for detecting a signal corresponding to an amount of the infrared light having entered the pixel 51, in other words, an amount of light received of the infrared light.

As a result, electric charges corresponding to the electrons having moved into the N+ semiconductor region 71-1 are accumulated in the N+ semiconductor region 71-1, and the electric charges are detected by the column processing unit 23 via the FD portion A, the amplifier transistor, the vertical signal line 29, and the like.

In other words, the accumulated electric charges in the N+ semiconductor region 71-1 are transferred to the FD portion A directly connected to the N+ semiconductor region 71-1, and a signal corresponding to the electric charges transferred to the FD portion A is read by the column processing unit 23 via the amplifier transistor and the vertical signal line 29. Then, the read signal is subjected to processing such as AD conversion processing in the column processing unit 23, and a pixel signal obtained as a result of the processing is supplied to the signal processing unit 26.

The pixel signal is a signal indicating an amount of electric charges corresponding to the electrons detected by the N+ semiconductor region 71-1, in other words, the amount of the electric charges accumulated in the FD portion A. That is, the pixel signal is a signal indicating the amount of light of the infrared light received by the pixel 51.

Furthermore, at the next timing, a voltage is applied by the pixel drive unit 22 to the two P+ semiconductor regions 73 via the pixel drive line 28, the contact, and the like so that an electric field is generated in an opposite direction to the direction of the electric field having been generated in the substrate 61 so far. Specifically, a positive voltage is applied to the P+ semiconductor region 73-2 and a voltage of 0 V is applied to the P+ semiconductor region 73-1.

As a result, an electric field is generated between the two P+ semiconductor regions 73 in the substrate 61, and a current flows from the P+ semiconductor region 73-2 to the P+ semiconductor region 73-1.

When the infrared light from the outside enters in the substrate 61 and is converted into a pair of electrons and holes by the photoelectric conversion in the substrate 61 in such a state, the obtained electrons are conducted in a direction toward the P+ semiconductor region 73-2 due to the electric field between the P+ semiconductor regions 73, and moves into the N+ semiconductor region 71-2.

As a result, electric charges corresponding to the electrons having moved into the N+ semiconductor region 71-2 are accumulated in the N+ semiconductor region 71-2, and the electric charges are detected by the column processing unit 23 via the FD portion B, the amplifier transistor, the vertical signal line 29, and the like.

In other words, the accumulated electric charges in the N+ semiconductor region 71-2 are transferred to the FD portion B directly connected to the N+ semiconductor region 71-2, and a signal corresponding to the electric charges transferred to the FD portion B is read by the column processing unit 23 via the amplifier transistor and the vertical signal line 29. Then, the read signal is subjected to processing such as AD conversion processing in the column processing unit 23, and a pixel signal obtained as a result of the processing is supplied to the signal processing unit 26.

In this way, when the pixel signals are obtained that are obtained by photoelectric conversion in periods different from each other in the same pixel 51, the signal processing unit 26 calculates distance information indicating the distance to the object on the basis of those pixel signals, and outputs the signals to the subsequent stage.

In particular, in the signal processing unit 26, if the distance information obtained for the pixel of the pixel array unit 21 is a pixel value of the pixel on the image corresponding to the pixel, an image (hereinafter referred to as a distance image) is obtained indicating a distance to a subject being in each region of an observation field of view of the solid-state imaging element 11. The distance image obtained in this way is also called a depth map.

As described above, a method of distributing signal carriers to the N+ semiconductor regions 71 different from each other and calculating distance information on the basis of a signal corresponding to the signal carriers, is called an indirect ToF method.

Configuration Example of Portion of Signal Extraction Portion

Figure 3:
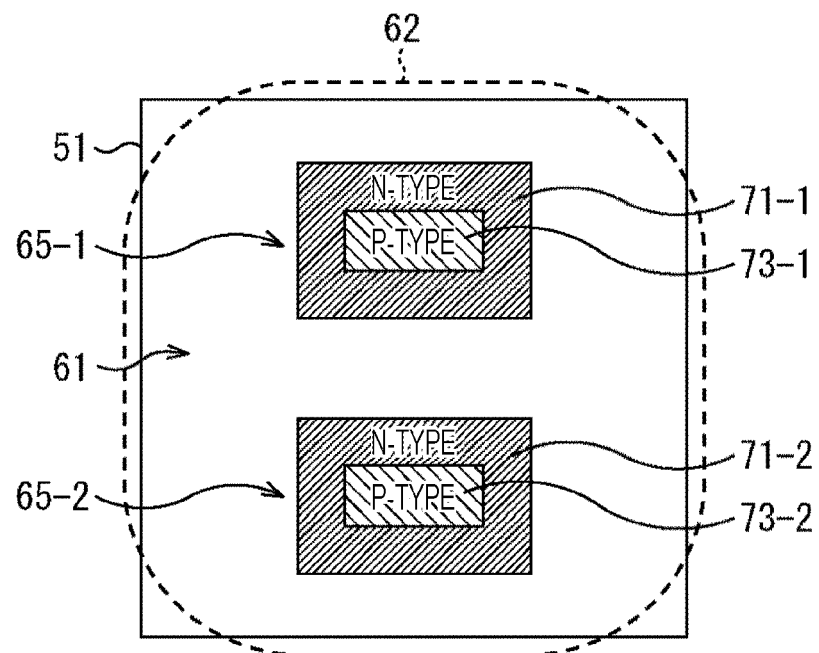
FIG. 3 is a diagram illustrating a configuration example of the pixel of the first embodiment.

When the portion of the signal extraction portion 65 in the pixel 51 is viewed in a direction from the top to the bottom in the figure, that is, in the direction perpendicular to the surface of the substrate 61, the periphery of the P+ semiconductor region 73 is surrounded by the P+ semiconductor region 71 as illustrated in FIG. 3, for example. In FIG. 3, the same reference numerals are given to portions corresponding to those illustrated in FIG. 2, and the description thereof will be omitted as appropriate.

In the example of FIG. 3, the oxide film 64 (not illustrated) is formed in a central portion of the pixel 51, and the signal extraction portion 65 is formed in a portion slightly on an end side from the center of the pixel 51. In particular, here, two signal extraction portions 65 are formed in the pixel 51.

Then, the P+ semiconductor region 73 is formed in a rectangular shape at a center position in the signal extraction portion 65, and the periphery of the P+ semiconductor region 73 is surrounded by the N+ semiconductor region 71 of a rectangular frame-shape, with the P+ semiconductor region 73 as the center. In other words, the N+ semiconductor region 71 is formed to surround the periphery of the P+ semiconductor region 73.

Note that, the shapes of the N+ semiconductor region 71 and the P+ semiconductor region 73 when viewed from the direction perpendicular to the substrate 61 are not limited to the rectangular shapes as illustrated in FIG. 3, and may be any shapes.

Figure 4:
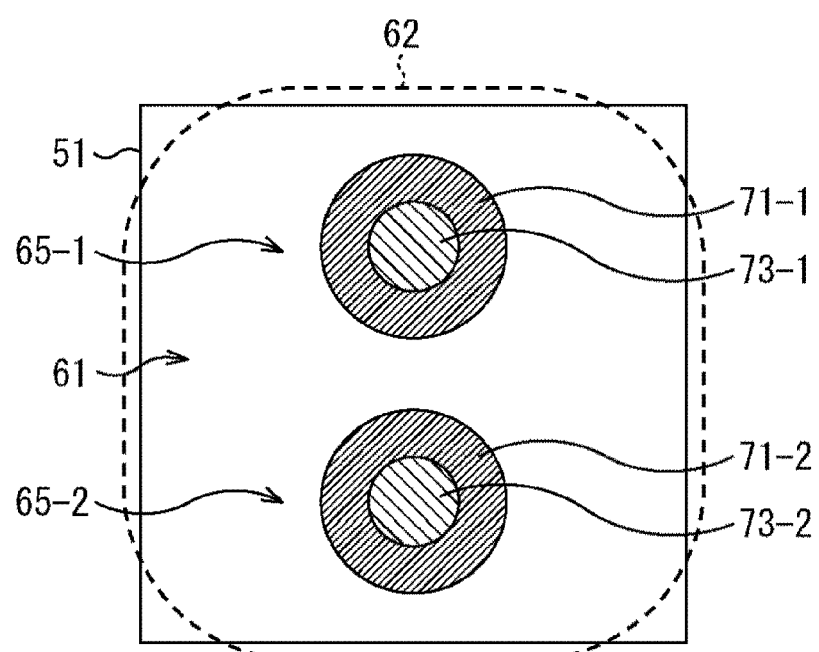
FIG. 4 is a diagram illustrating a configuration example of the pixel of the first embodiment.

For example, as illustrated in FIG. 4, the N+ semiconductor region 71 and the P+ semiconductor region 73 may have circular shapes. Note that, in FIG. 4, the same reference numerals are given to portions corresponding to those illustrated in FIG. 3, and the description thereof will be omitted as appropriate.

In the example of FIG. 4, the P+ semiconductor region 73 of a circular shape is formed at a center position in the signal extraction portion 65, and the periphery of the P+ semiconductor region 73 is surrounded by the N+ semiconductor region 71 of an annular shape, with the P+ semiconductor region 73 as the center.

Note that, as illustrated in FIGS. 3 and 4, the on-chip lens 62 is formed to cover substantially the whole region of one pixel 51 in a case where the pixel 51 is viewed in a plan view. In other words, in the present embodiment, one on-chip lens 62 is provided for each pixel 51.

Transfer Efficiency

By the way, in the distance measurement by the indirect ToF method using the CAPD sensor, to further reduce the distance measurement error, it is necessary to increase pixel sensitivity. The pixel sensitivity is said to be proportional to a product of a pixel area, quantum efficiency, aperture ratio, and transfer efficiency.

The transfer efficiency (Contrast between active and inactive tap (Cmod)) refers to a ratio of signal charges conducted to a signal extraction portion (Active Tap) to which a voltage is applied, out of signal charges generated by photoelectric conversion in the substrate.

Figure 5:
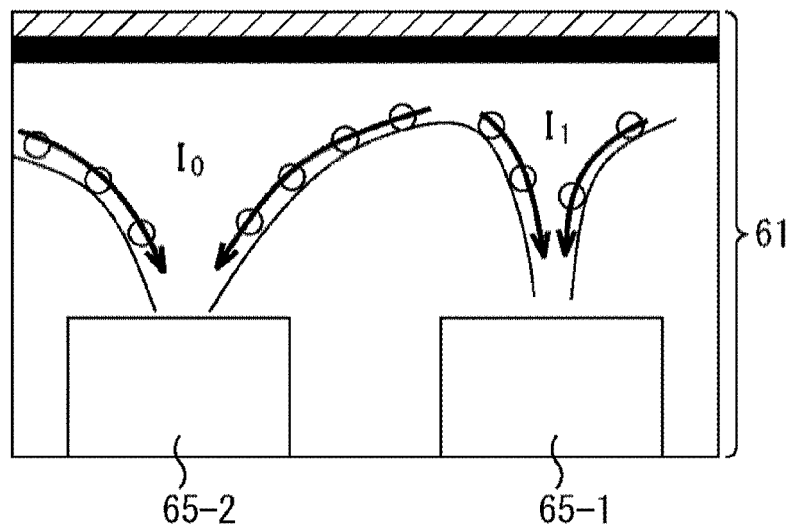
FIG. 5 is a diagram for explaining transfer efficiency.

FIG. 5 illustrates a configuration example of a pixel provided in a conventional CAPD sensor. The pixel illustrated in FIG. 5 is similar to a pixel excluding the on-chip lens 62 from the pixel 51 illustrated in FIG. 2.

Here, it is assumed that the signal extraction portion 65-2 is an Active Tap from which a signal is read, and the signal extraction portion 65-1 is an Inactive Tap from which no signal is read.

Here, assuming that a current (amount of electric charges) flowing into the Active Tap (signal extraction portion 65-2) is $I_0$, and a current (amount of electric charges) flowing into the Inactive Tap (signal extraction portion 65-1) is $I_1$, the transfer efficiency (Cmod) is expressed by a ratio between the current $I_0$ flowing into the Active Tap and the current $I_1$ flowing into the Inactive Tap.

Ideally, all the signal charges generated by the photoelectric conversion in the substrate are conducted to the Active Tap. In this case, the current $I_1$ flowing into the Inactive Tap is 0, and the transfer efficiency is 100%.

However, since the pixel illustrated in FIG. 5 is not provided with a converging structure that converges light, the photoelectric conversion is performed on the entire surface of the pixel (substrate). Therefore, the current $I_1$ corresponding to signal charges generated in the vicinity of the signal extraction portion 65-1 by the photoelectric conversion flows into the Inactive Tap (signal extraction portion 65-1). As a result, the transfer efficiency decreases, and the distance measurement error increases.

On the other hand, the pixel 51 of the present embodiment is provided with the on-chip lens 62 that converges light having entered from the outside and causes the light to enter in the substrate 61.

Figure 6:
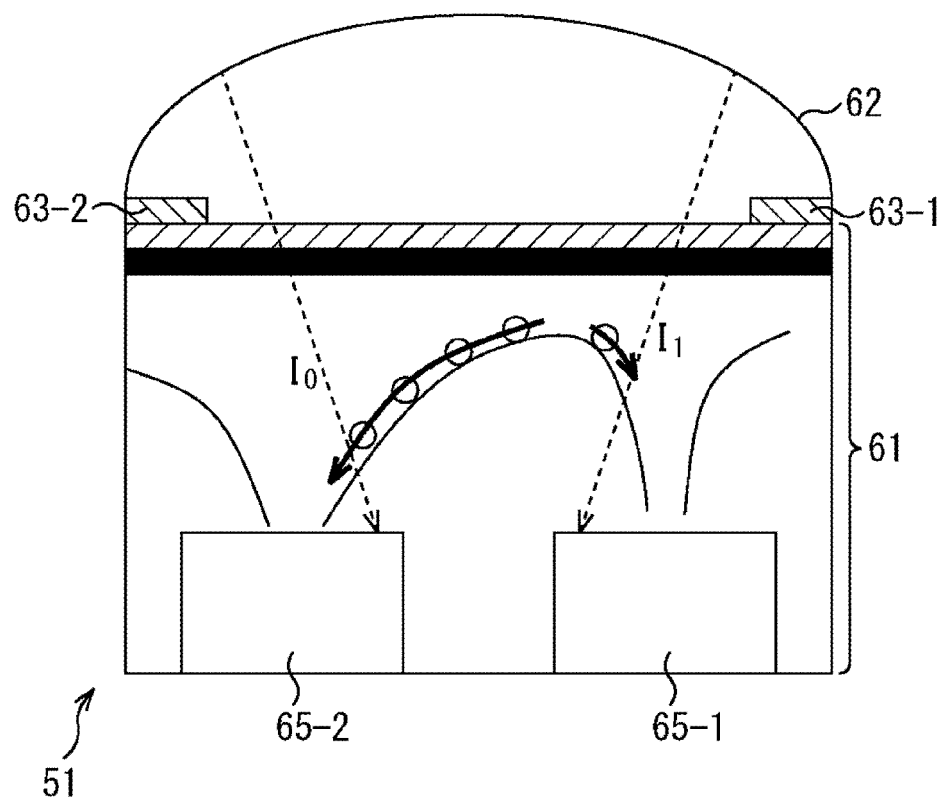
FIG. 6 is a diagram for illustrating transfer efficiency.

With the on-chip lens 62, as illustrated in FIG. 6, infrared light having entered the on-chip lens 62 from the outside is converged at the vicinity of the center of the pixel 51 in the substrate 61, specifically, between the signal extraction portion 65-1 and the signal extraction portion 65-2. As a result, the photoelectric conversion in the vicinity of the signal extraction portion 65-1 is suppressed, the current $I_1$ flowing into the Inactive Tap (signal extraction portion 65-1) can be reduced, whereby the transfer efficiency can be increased.

Thus, according to the above configuration, the on-chip lens 62 converges the light between the signal extraction portion 65-1 and the signal extraction portion 65-2, whereby the transfer efficiency can be increased, and the distance measurement error can be reduced.

3. Variation of Converging Portion

In the above description, as the converging portion, the configuration has been described of the pixel 51 in which the on-chip lens 62 is formed; however, the converging portion only needs to have a function to converge the light between the signal extraction portion 65-1 and the signal extraction portion 65-2.

In the following, variations will therefore be described of the converging portion formed in the pixel 51.

Example 1

Figure 7:
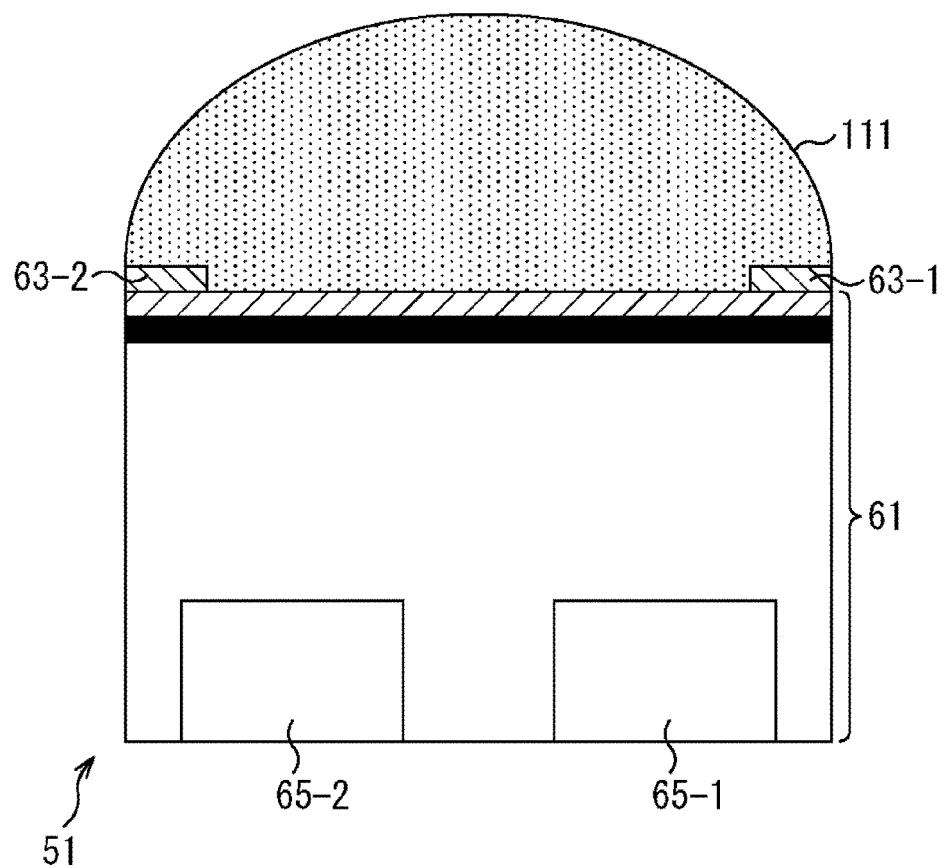
FIG. 7 is a diagram illustrating another configuration example of the pixel.

FIG. 7 illustrates another configuration example of the pixel 51.

In the pixel 51 of FIG. 7, an on-chip lens 111 having an upwardly convex curved surface shape is formed as the converging portion instead of the on-chip lens 62 in the pixel 51 of FIG. 2.

The on-chip lens 111 is a reflow lens formed by reflow processing. As a result, thickening of the on-chip lens 111 can be achieved to match a converging range.

Even in such a configuration, the on-chip lens 111 converges the light between the signal extraction portion 65-1 and the signal extraction portion 65-2, whereby the transfer efficiency can be increased, and the distance measurement error can be reduced.

Example 2

Figure 8:
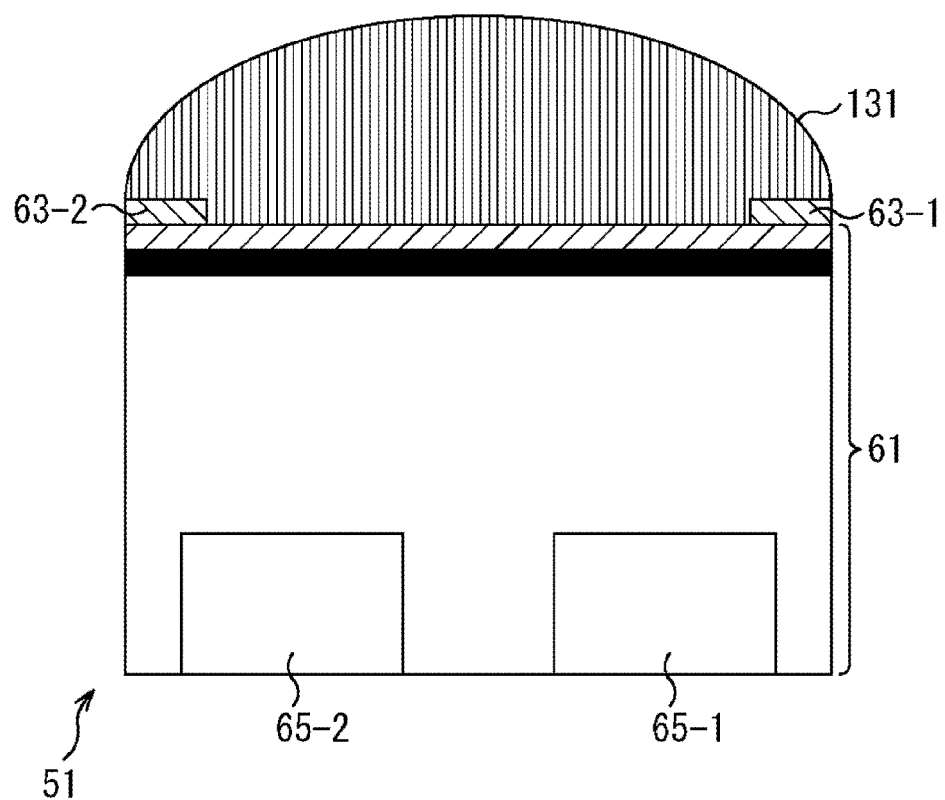
FIG. 8 is a diagram illustrating another configuration example of the pixel.

FIG. 8 illustrates another configuration example of the pixel 51.

In the pixel 51 of FIG. 8, an on-chip lens 131 having an upwardly convex curved surface shape is formed as the converging portion instead of the on-chip lens 62 in the pixel 51 of FIG. 2.

The on-chip lens 131 is formed using a high refractive index material as a lens material. As a result, converging ability of the on-chip lens 131 can be improved.

Even in such a configuration, the on-chip lens 131 converges the light between the signal extraction portion 65-1 and the signal extraction portion 65-2, whereby the transfer efficiency can be increased, and the distance measurement error can be reduced.

Example 3

Figure 9:
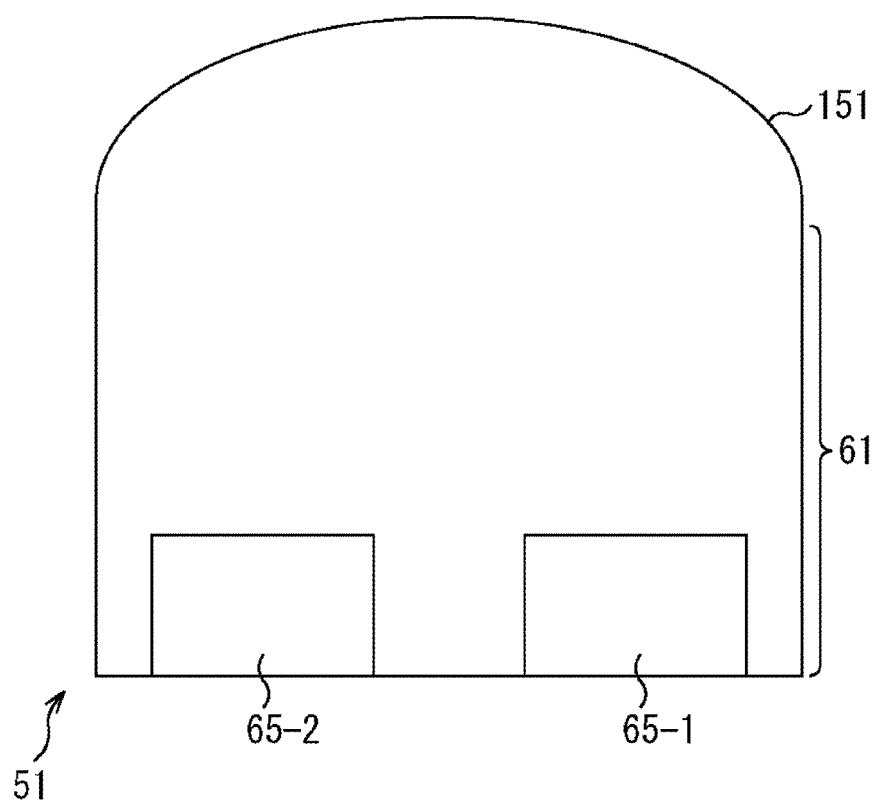
FIG. 9 is a diagram illustrating another configuration example of the pixel.

FIG. 9 illustrates another configuration example of the pixel 51.

In the pixel 51 of FIG. 9, an on-chip lens 151 having an upwardly convex curved surface shape is formed as the converging portion instead of the on-chip lens 62 in the pixel 51 of FIG. 2.

The on-chip lens 151 is formed by transfer of a lens shape, by etching, onto a substrate material (for example, silicon) constituting the substrate 61. In the on-chip lens 151, pinning of the lens surface is performed with a negative fixed charge film for the purpose of suppressing a dark current, and an anti-reflection film (not illustrated) formed on the surface.

Even in such a configuration, the on-chip lens 151 converges the light between the signal extraction portion 65-1 and the signal extraction portion 65-2, whereby the transfer efficiency can be increased, and the distance measurement error can be reduced.

Example 4

Figure 10:
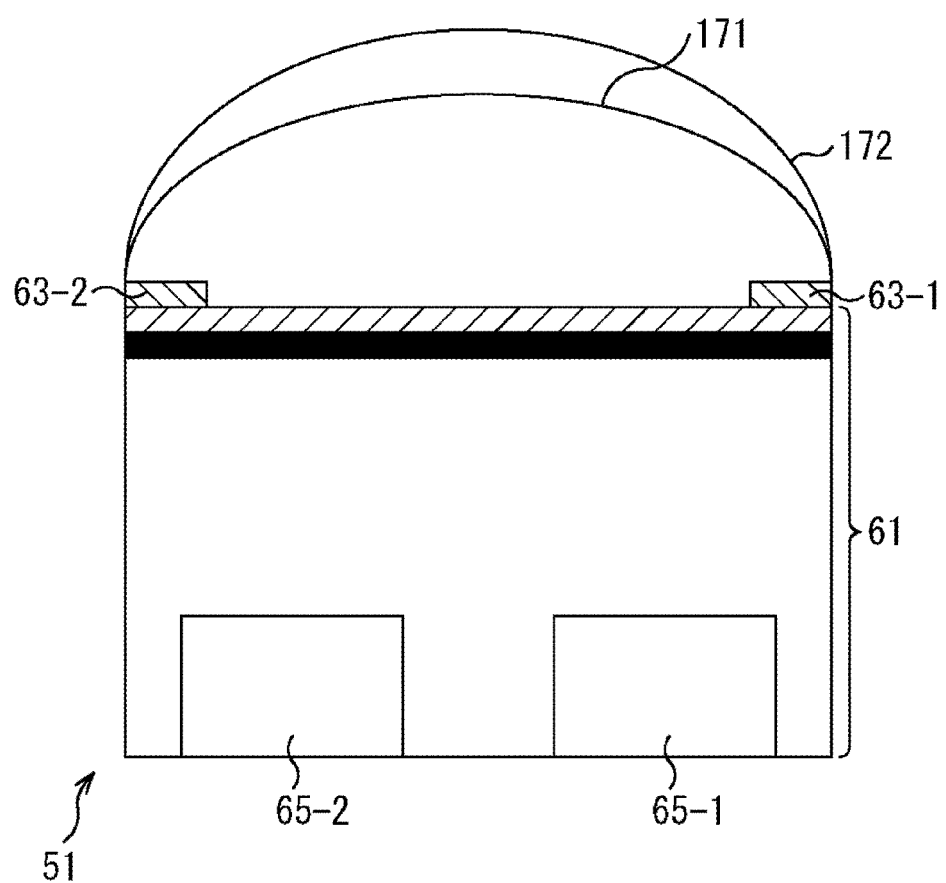
FIG. 10 is a diagram illustrating another configuration example of the pixel.

FIG. 10 illustrates another configuration example of the pixel 51.

In the pixel 51 of FIG. 10, an on-chip lens 171 having an upwardly convex curved surface shape is formed as the converging portion instead of the on-chip lens 62 in the pixel 51 of FIG. 2. Furthermore, in the example of FIG. 10, an overcoat layer 172 is formed on the on-chip lens 171.

The on-chip lens 171 is formed including an organic material, for example, a styrene-based resin, an acrylic-based resin, a styrene-acrylic copolymer-based resin, a siloxane-based resin, or the like. Furthermore, the on-chip lens 171 may be formed including a SiN-based or SIGN-based inorganic material.

The overcoat layer 172 is formed including a material similar to or different from the on-chip lens 171. Depending on the material forming the overcoat layer 172, the overcoat layer 172 can have various functions such as a function of anti-reflection, and a function of prevention of deterioration such as deformation and coloration.

Even in such a configuration, the on-chip lens 171 converges the light between the signal extraction portion 65-1 and the signal extraction portion 65-2, whereby the transfer efficiency can be increased, and the distance measurement error can be reduced.

Example 5

Figure 11:
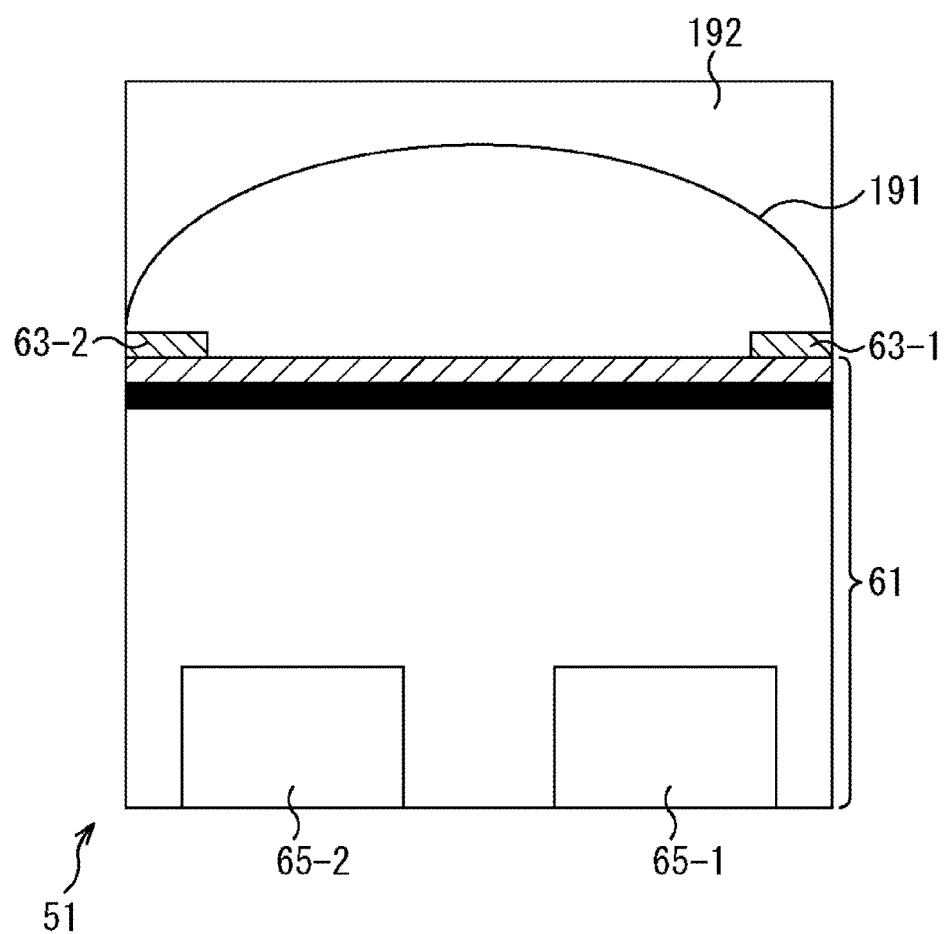
FIG. 11 is a diagram illustrating another configuration example of the pixel.

FIG. 11 illustrates another configuration example of the pixel 51.

In the pixel 51 of FIG. 11, an on-chip lens 191 having an upwardly convex curved surface shape is formed as the converging portion instead of the on-chip lens 62 in the pixel 51 of FIG. 2. Furthermore, in the example of FIG. 10, a planarizing film 192 is formed on the on-chip lens 191.

The on-chip lens 191 is formed including an organic material, for example, a styrene-based resin, an acrylic-based resin, a styrene-acrylic copolymer-based resin, a siloxane-based resin, or the like. Furthermore, the on-chip lens 171 may be formed including a SiN-based or SiON-based inorganic material.

The planarizing film 192 is formed including a material having a refractive index lower than that of the material forming the on-chip lens 191.

The planarizing film 192 is formed on the on-chip lens 191, whereby the solid-state imaging element 11 can adopt a cavity-less structure in which a gap (cavity) on a light receiving surface side is sealed with seal resin or seal glass.

Even in such a configuration, the on-chip lens 191 converges the light between the signal extraction portion 65-1 and the signal extraction portion 65-2, whereby the transfer efficiency can be increased, and the distance measurement error can be reduced.

Example 6

Figure 12:
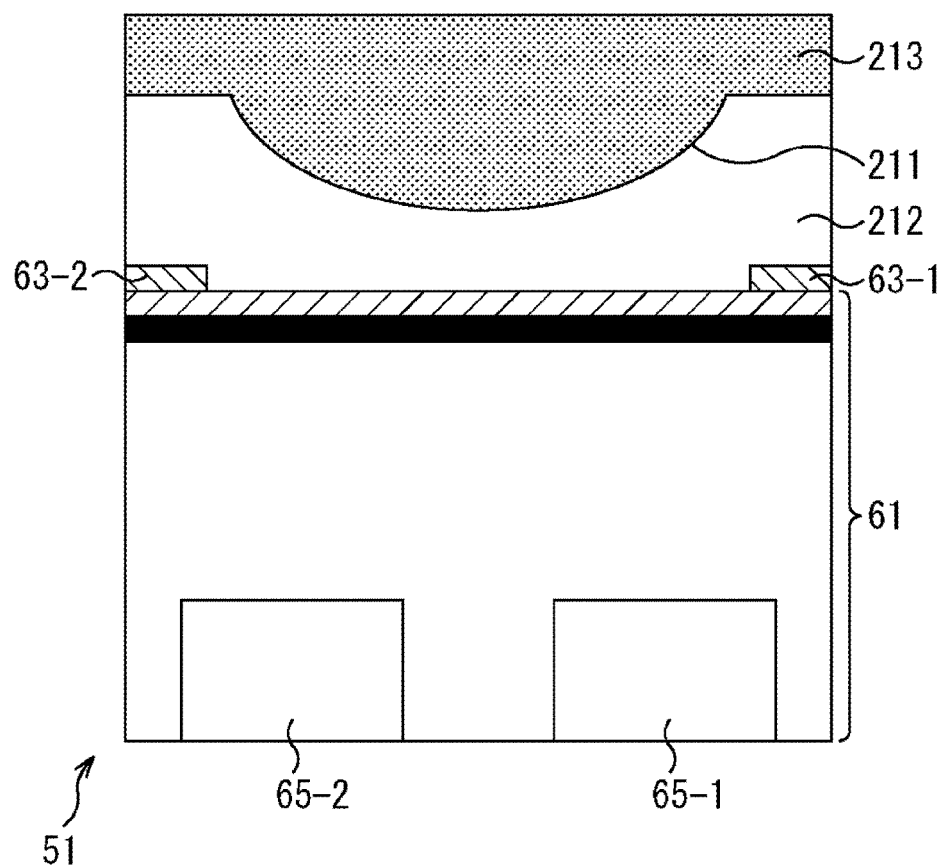
FIG. 12 is a diagram illustrating another configuration example of the pixel.

FIG. 12 illustrates another configuration example of the pixel 51.

In the pixel 51 of FIG. 12, an on-chip lens 211 having a downwardly convex curved surface shape is formed as the converging portion instead of the on-chip lens 62 in the pixel 51 of FIG. 2.

For example, seal resin 213 having a refractive index higher than that of a planarizing film 212 is sealed in a concave portion formed in the planarizing film 212 on the substrate 61, whereby the on-chip lens 211 is formed.

Even in such a configuration, the on-chip lens 211 converges the light between the signal extraction portion 65-1 and the signal extraction portion 65-2, whereby the transfer efficiency can be increased, and the distance measurement error can be reduced.

Example 7

Figure 13:
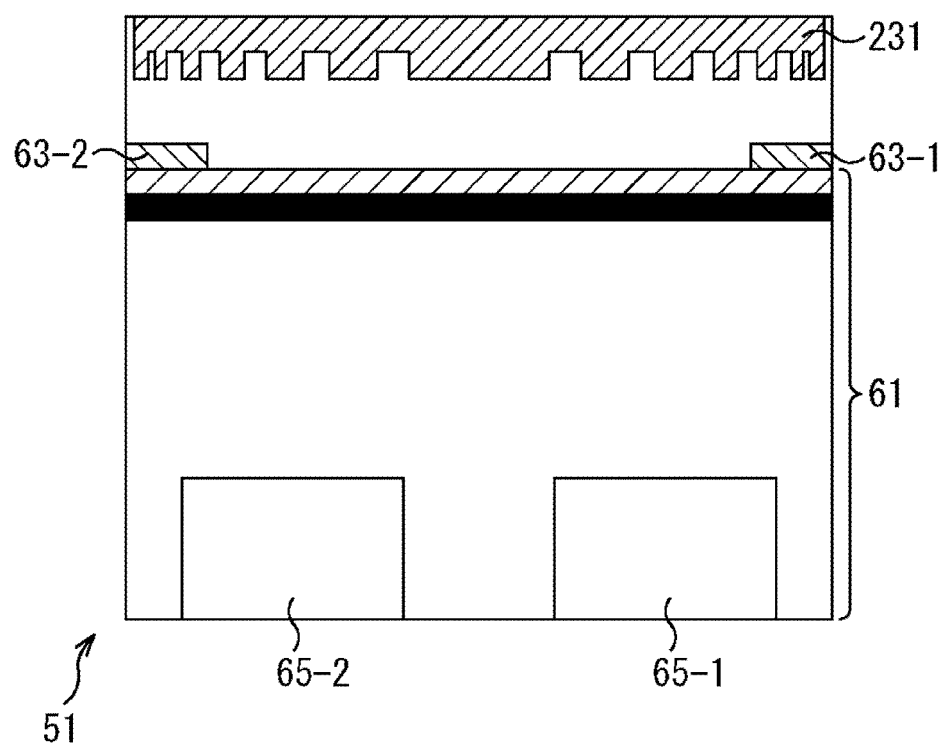
FIG. 13 is a diagram illustrating another configuration example of the pixel.

FIG. 13 illustrates another configuration example of the pixel 51

In the pixel 51 of FIG. 13, a diffractive lens 231 is formed as the converging portion instead of the on-chip lens 62 in the pixel 51 of FIG. 2.

The diffractive lens 231 has a function of converging light having entered, by utilizing a diffraction phenomenon of light. A plurality of grooves is provided concentrically arranged on the surface of a flat lens material, whereby the diffractive lens 231 is formed.

Even in such a configuration, the diffractive lens 231 converges the light between the signal extraction portion 65-1 and the signal extraction portion 65-2, whereby the transfer efficiency can be increased, and the distance measurement error can be reduced.

Example 8

Figure 14:
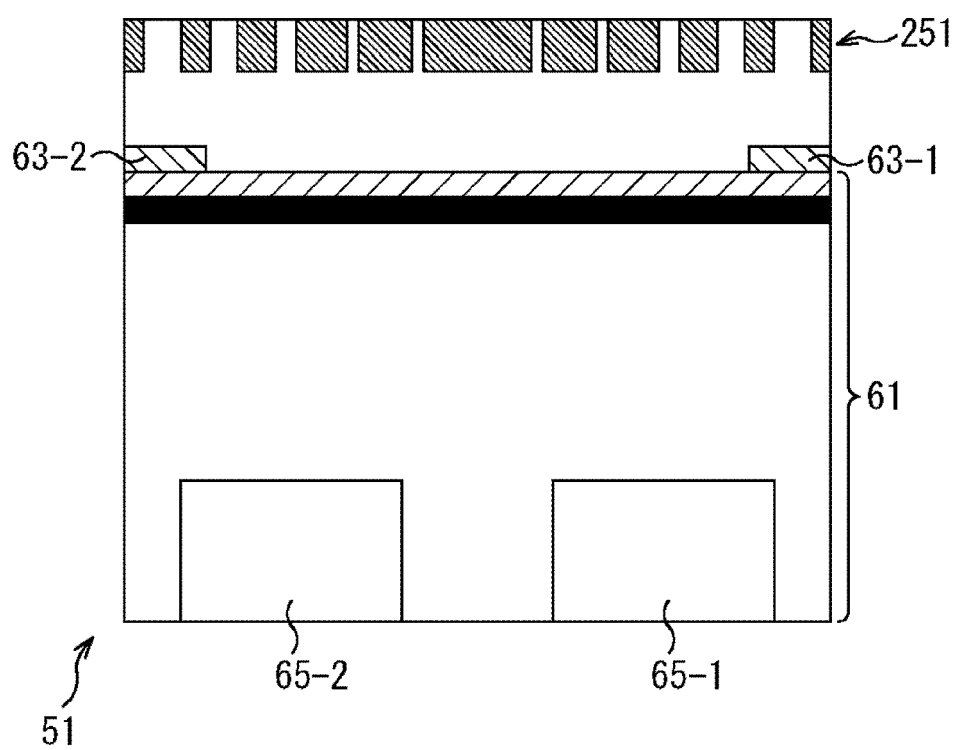
FIG. 14 is a diagram illustrating another configuration example of the pixel.

FIG. 14 illustrates another configuration example of the pixel 51.

In the pixel 51 of FIG. 14, a gradient index lens 251 is formed as the converging portion instead of the on-chip lens 62 in the pixel 51 of FIG. 2.

In the gradient index lens 251, high refractive index layers and low refractive index layers are alternately arranged at predetermined intervals concentrically around the optical axis. The gradient index lens 251 is constituted as a subwave length lens (SWLL), for example.

Even in such a configuration, the gradient index lens 251 converges the light between the signal extraction portion 65-1 and the signal extraction portion 65-2, whereby the transfer efficiency can be increased, and the distance measurement error can be reduced.

Example 9

Figure 15:
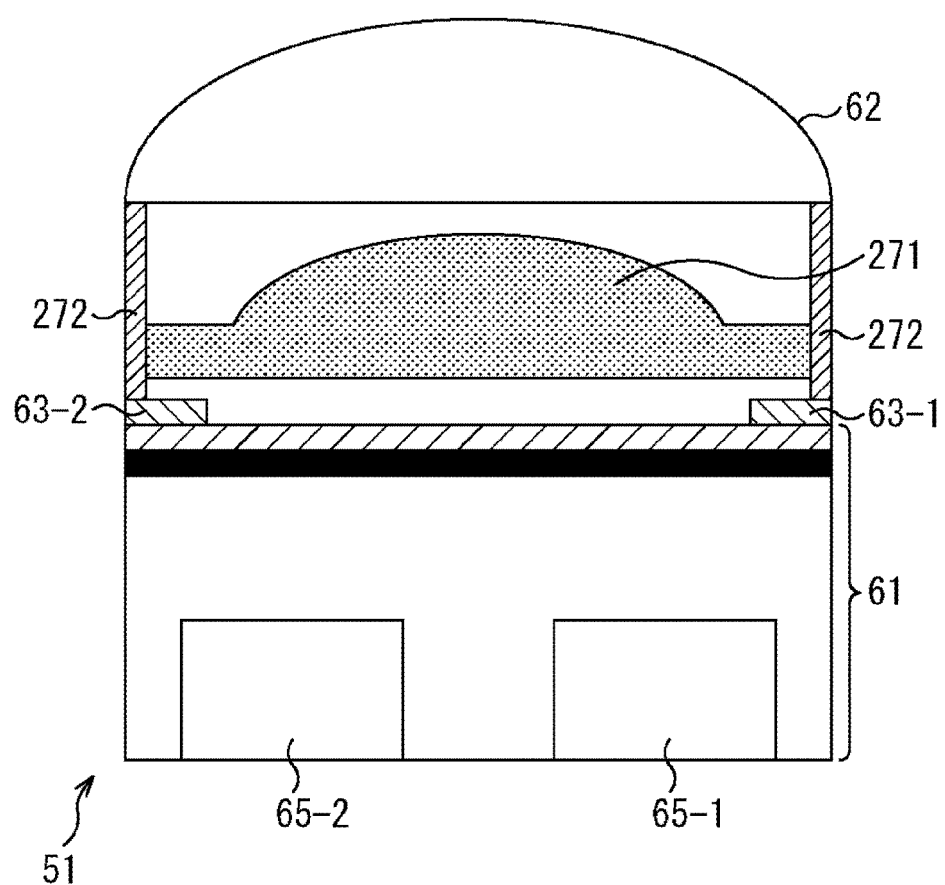
FIG. 15 is a diagram illustrating another configuration example of the pixel.

FIG. 15 illustrates another configuration example of the pixel 51.

In the pixel 51 of FIG. 15, an in-layer lens 271 having an upwardly convex curved surface shape is formed between the substrate 61 and the on-chip lens 62 as the converging portion in the pixel 51 of FIG. 2.

With the in-layer lens 271, the converging ability of the on-chip lens 62 can be improved.

Furthermore, in the example of FIG. 15, the pixel 51 includes a separation wall 272 that separates a layer in which the in-layer lens 271 is formed, for each pixel. The separation wall 272 may be formed including a metal film including W, Al, or the like, or may be formed including a Si oxide film including SiO2, SiN, or the like. Occurrence of color mixing between pixels can be suppressed by the separation wall 272.

Even in such a configuration, the on-chip lens 62 and the in-layer lens 271 converge the light between the signal extraction portion 65-1 and the signal extraction portion 65-2, whereby the transfer efficiency can be increased, and the distance measurement error can be reduced.

Note that, in the example of FIG. 15, instead of the on-chip lens 62, configurations may be applied described with reference to FIGS. 6 to 14. Furthermore, in the example of FIG. 15, the in-layer lens 271 adopts the shape having the upwardly convex curved surface shape, but may adopt a shape of a downwardly convex curved surface shape.

4. Variation of Pixel Separation Portion

A pixel separation portion may be provided between pixels formed in the pixel array unit 21 to improve a separation characteristic between adjacent pixels and suppress color mixing.

In the following, variations will therefore be described of the pixel separation portion formed in the pixel 51.

Example 1

Figure 16:
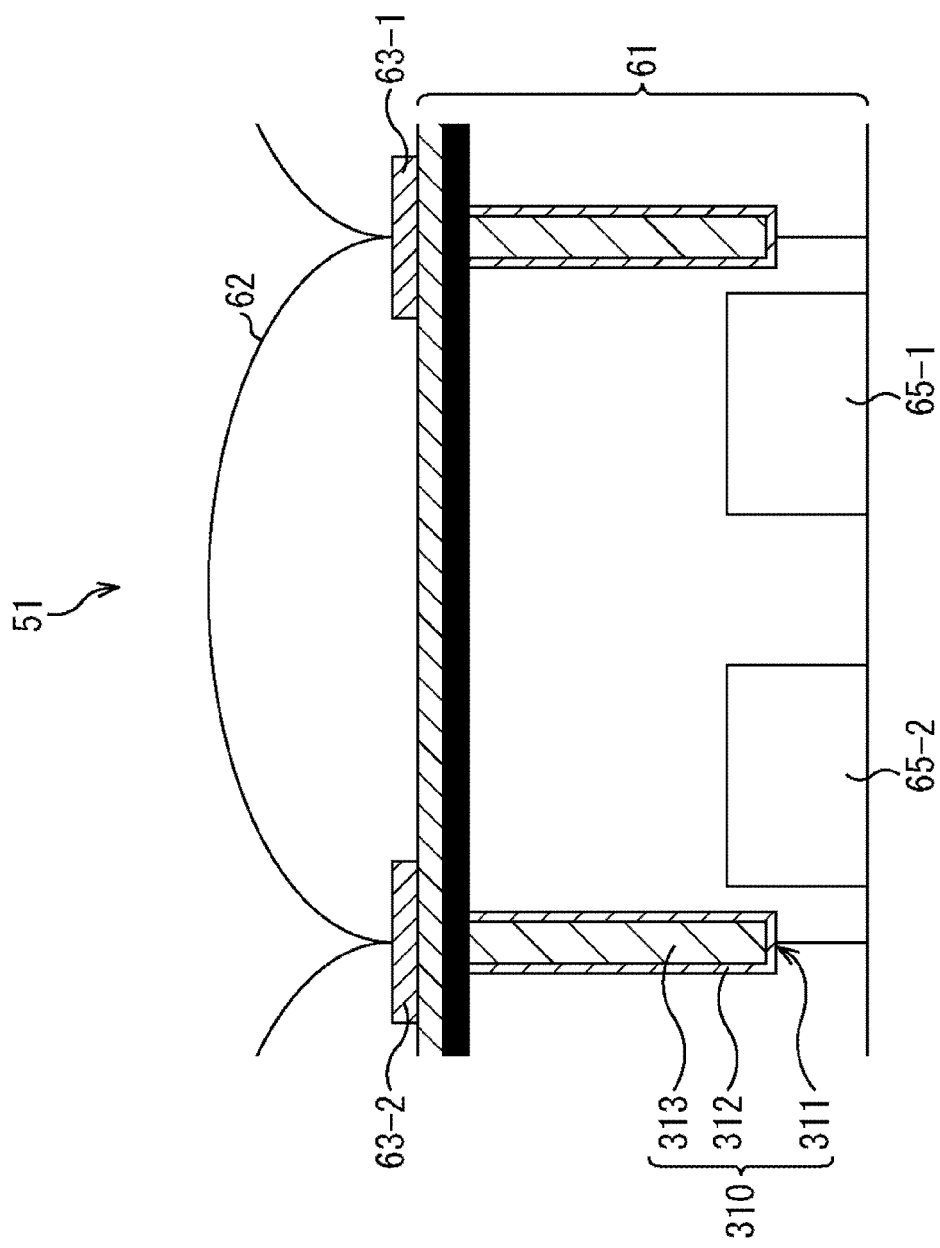
FIG. 16 is a diagram illustrating another configuration example of the pixel.

FIG. 16 illustrates another configuration example of the pixel 51.

In the pixel 51 of FIG. 16, in addition to the configuration similar to the pixel 51 of FIG. 2, a pixel separation portion 310 that separates the substrate 61 for each pixel is formed to divide a plurality of the pixels 51.

The pixel separation portion 310 includes a groove portion 311, a fixed charge film 312, and an insulating film 313. The pixel separation portion 310 is formed to be embedded inside the substrate 61 in a back surface (upper surface in the figure) side of the substrate 61.

Specifically, in the back surface (upper surface) side of the substrate 61, the groove portion 311 is formed to penetrate a part of a boundary portion between the pixels 51 in the substrate 61. The inside of the groove portion 311 is covered with the fixed charge film 312, and moreover, the groove portion 311 is filled with the insulating film 313, whereby the pixel separation portion 310 is constituted.

In a case where the solid-state imaging element 11 is viewed from the upper surface side in the figure, the pixel separation portion 310 has a planar shape in a lattice shape, and is interposed between the plurality of pixels 51.

As the insulating film 313 of the pixel separation portion 310, for example, a silicon oxide film (SiO), a silicon nitride film (SiN), or the like can be adopted. The pixel separation portion 310 may be formed by shallow trench isolation (STI), for example.

With such a configuration, the separation characteristic between adjacent pixels can be improved, and the color mixing can be suppressed.

Example 2

Figure 17:
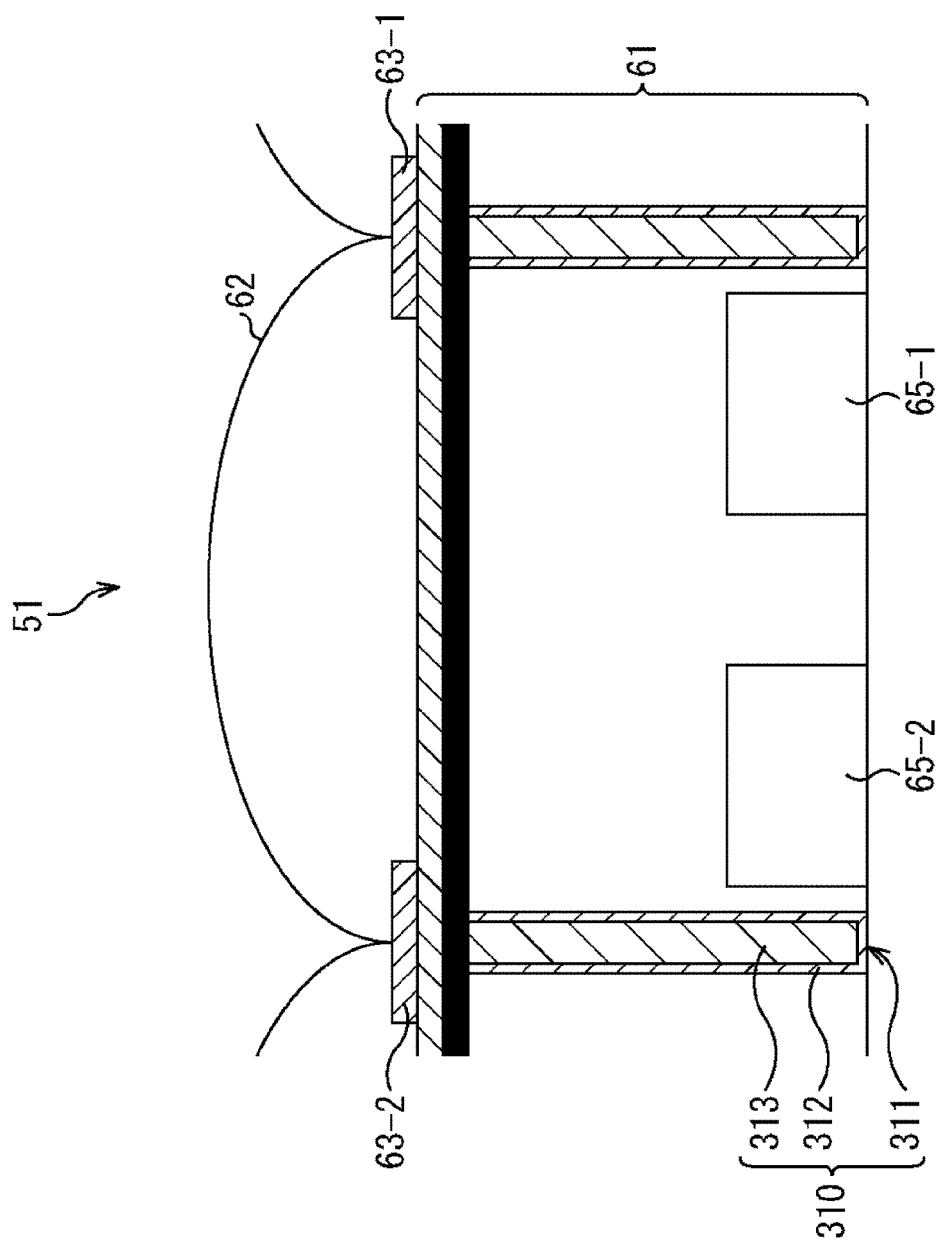
FIG. 17 is a diagram illustrating another configuration example of the pixel.

FIG. 17 illustrates another configuration example of the pixel 51

In the pixel 51 of FIG. 17, similarly to the pixel 51 of FIG. 16, the pixel separation portion 310 that separates the substrate 61 for each pixel is formed to divide the plurality of pixels 51.

However, in the pixel 51 of FIG. 17, the height of the pixel separation portion 310 (the length in the vertical direction in the figure) is set to the same height as the substrate 61.

With such a configuration, the separation characteristic between adjacent pixels can be further improved.

Example 3

Figure 18:
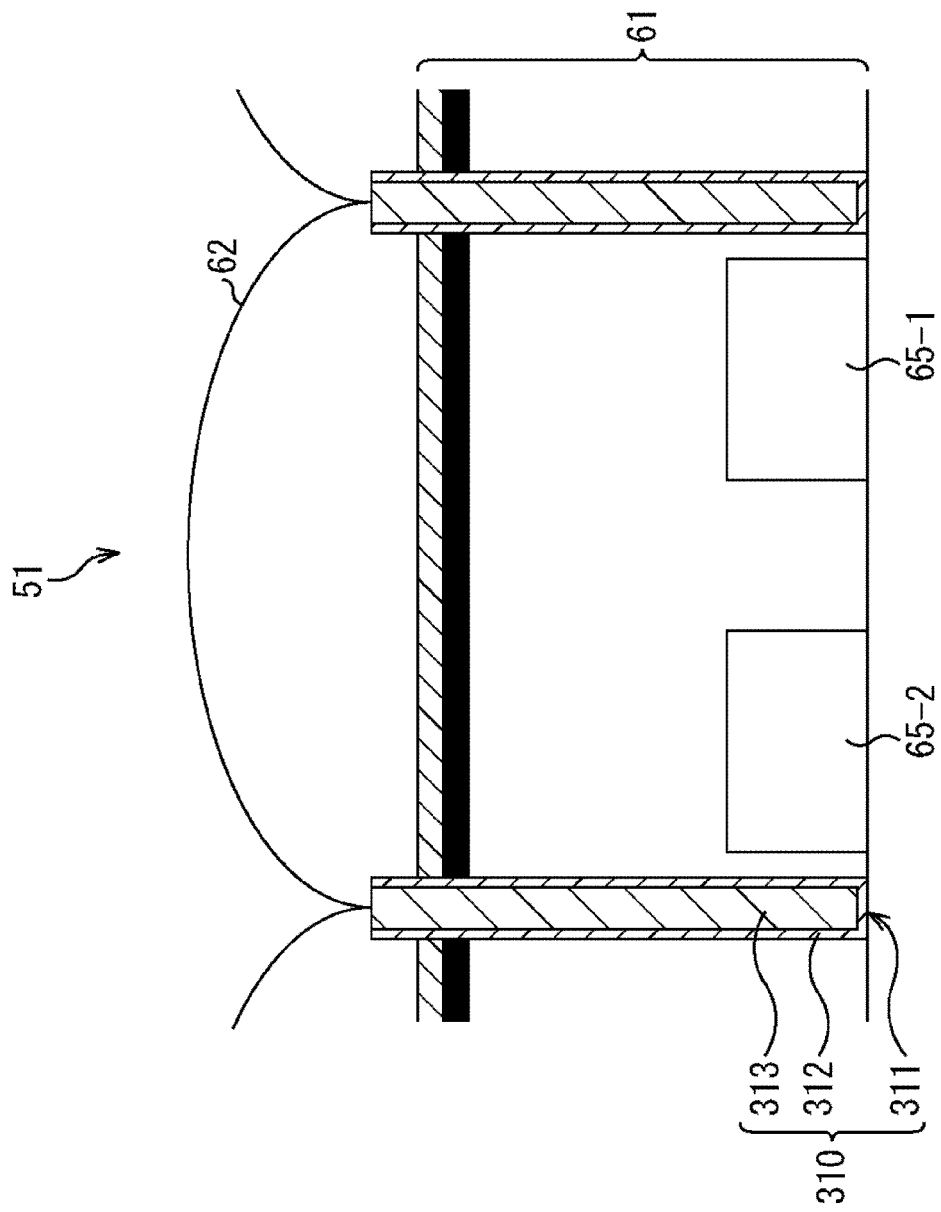
FIG. 18 is a diagram illustrating another configuration example of the pixel.

FIG. 18 illustrates another configuration example of the pixel 51.

In the pixel 51 of FIG. 18, similarly to the pixel 51 of FIG. 17, the pixel separation portion 310 that separates the substrate 61 for each pixel is formed to divide the plurality of pixels 51.

However, in the pixel 51 of FIG. 18, the height of the pixel separation portion 310 exceeds the height of the substrate 61 and reaches the on-chip lens 62. Note that, in the example of FIG. 18, the inter-pixel light shielding portion 63 is not formed on the substrate 61.

With such a configuration, the separation characteristic between adjacent pixels can be further improved.

Example 4

Figure 19:
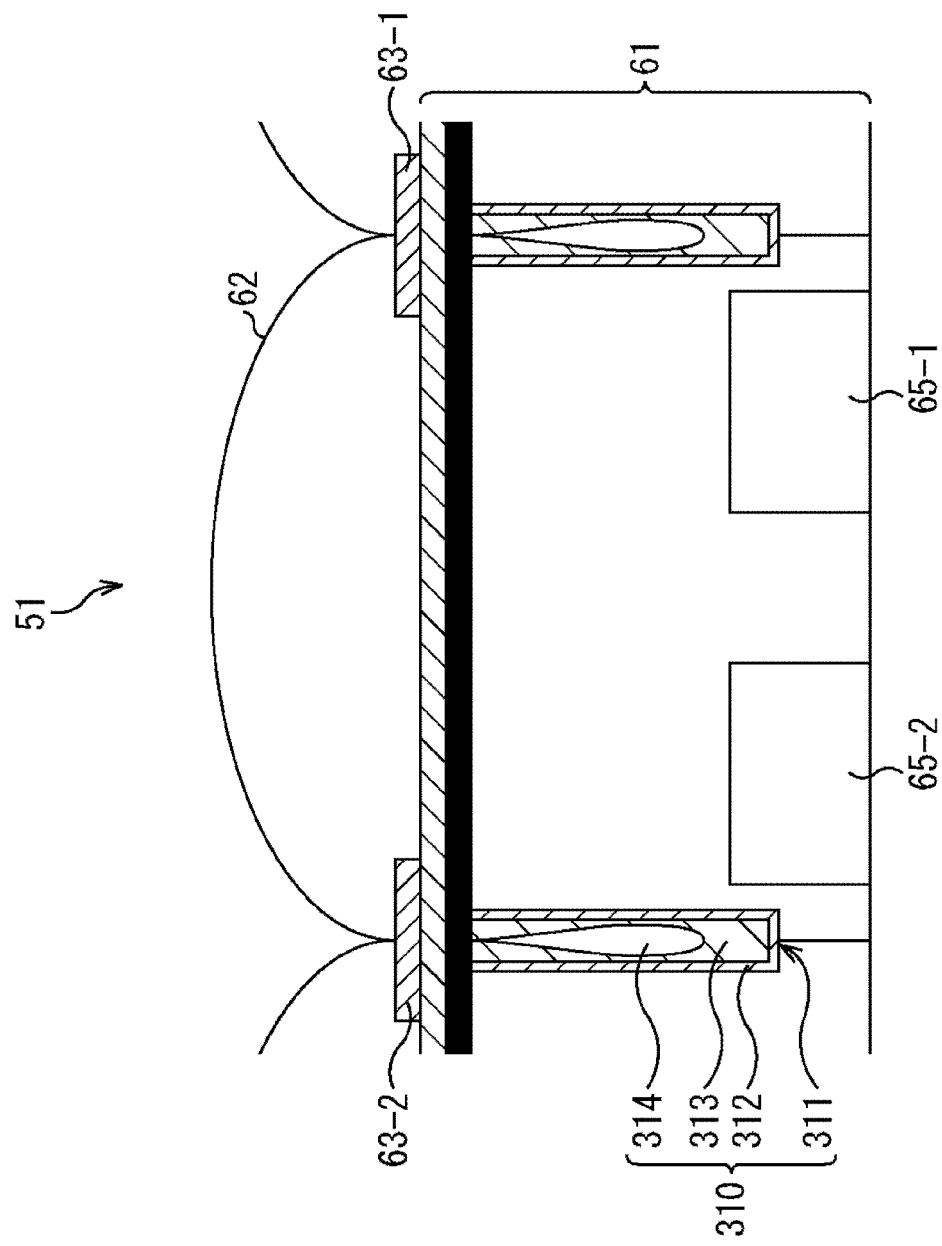
FIG. 19 is a diagram illustrating another configuration example of the pixel.

FIG. 19 illustrates another configuration example of the pixel 51.

In the pixel 51 of FIG. 19, similarly to the pixel 51 of FIG. 16, the pixel separation portion 310 that separates the substrate 61 for each pixel is formed to divide the plurality of pixels 51.

However, in the pixel 51 of FIG. 19, the pixel separation portion 310 has a hollow structure.

The fixed charge film 312 and the insulating film 313 are embedded in that order in the groove portion 311 formed in the depth direction from the back surface side (upper side) of the substrate 61, whereby the pixel separation portion 310 of FIG. 19 is formed. A hollow portion (so-called void) 314 is formed inside the groove portion 311.

To form the hollow portion 314 in the groove portion 311, the insulating film 313 is formed with a film thickness that does not fill all the groove portion 311, inside the groove portion 311, and is formed to close the groove portion 311 at the opening end of the groove portion 311. The insulating film 313 can be formed including a material such as silicon oxide, silicon nitride, silicon oxynitride, resin, or the like, for example.

With such a configuration as well, the separation characteristic between adjacent pixels can be improved, and the color mixing can be suppressed.

5. Other Variations

Hereinafter, modifications will be described of configurations other than the converging portion and the pixel separation portion that can be applied to the configurations described above.

Inter-Pixel Light Shielding Portion

As described above, in the pixel 51 of the present embodiment, the photoelectric conversion in the vicinity of the Inactive Tap is suppressed, and the current flowing into the Inactive Tap is reduced, whereby the transfer efficiency can be increased.

The width of the inter-pixel light shielding portion 63 formed on the substrate 61 is therefore adjusted and the light is caused not to enter the Inactive Tap, whereby the photoelectric conversion in the vicinity of the Inactive Tap may be suppressed and the current flowing into the Inactive Tap may be reduced.

Figure 20:
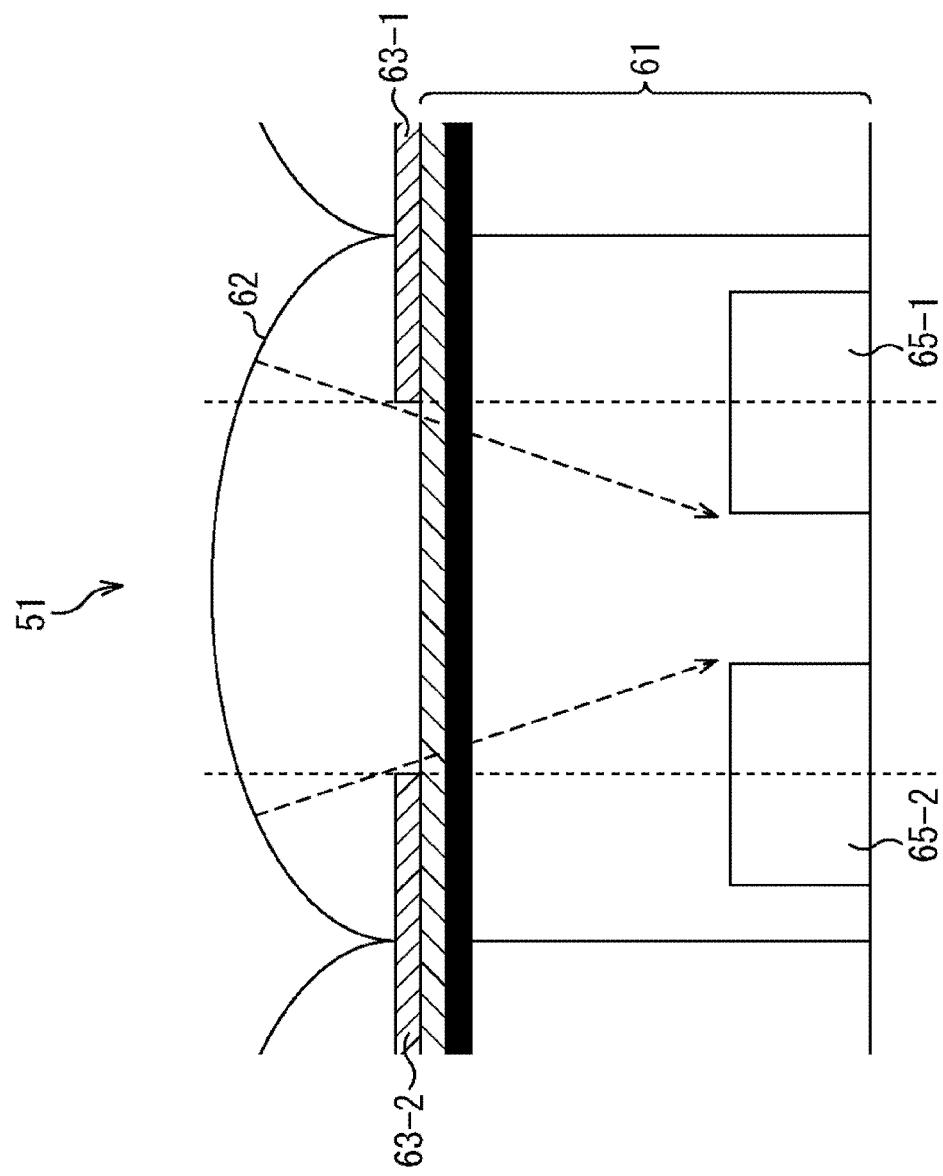
FIG. 20 is a diagram illustrating another configuration example of the pixel.

For example, as illustrated in FIG. 20, the inter-pixel light shielding portion 63 is formed so that the width of the inter-pixel light shielding portion 63 is adjusted and the inter-pixel light shielding portion 63 covers half of each Tap (signal extraction portions 65-1 and 65-2).

With this configuration, since the light can be caused not to enter the Inactive Tap, as a result, the transfer efficiency can be increased.

Figure 21:
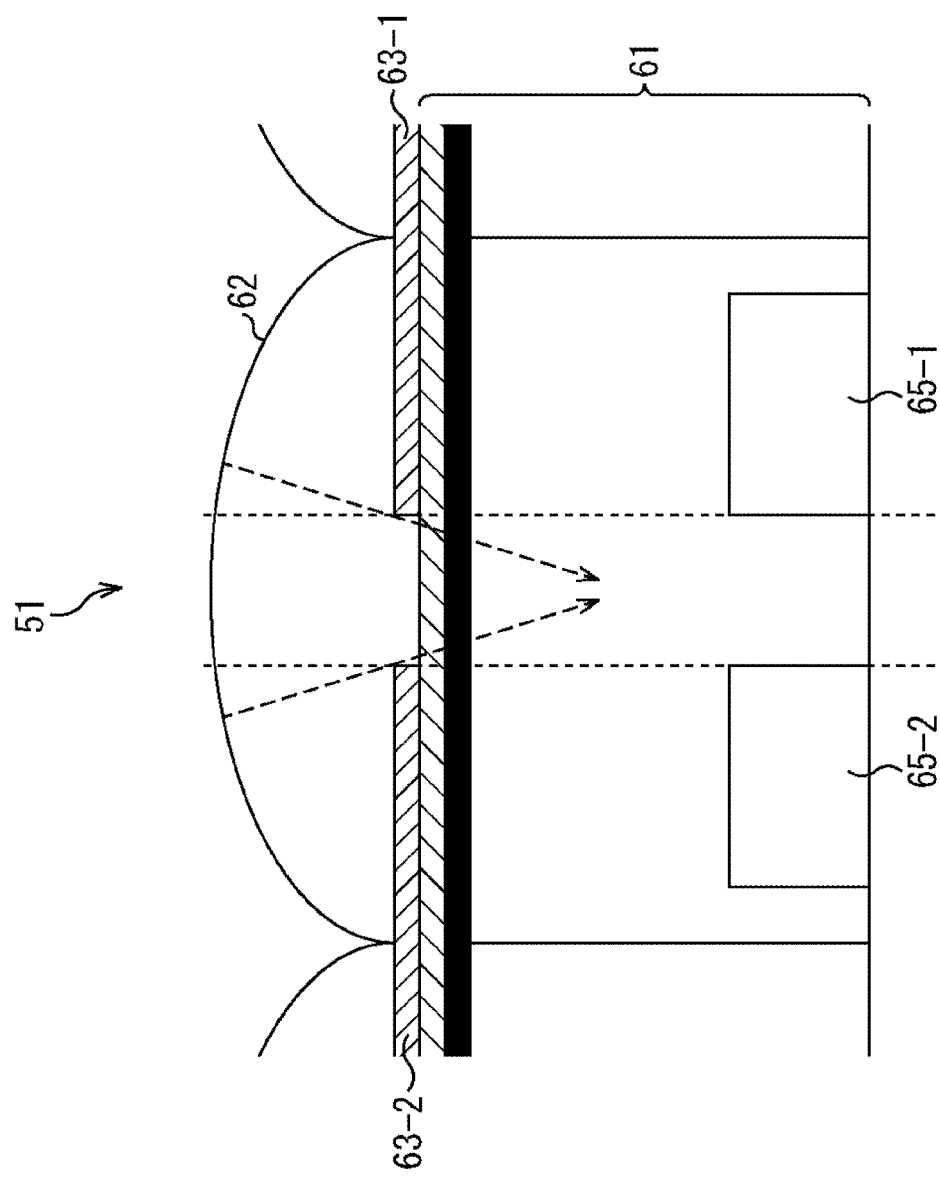
FIG. 21 is a diagram illustrating another configuration example of the pixel.

Furthermore, as illustrated in FIG. 21, the inter-pixel light shielding portion 63 may be formed so that the width of the inter-pixel light shielding portion 63 is adjusted and the inter-pixel light shielding portion 63 covers the whole of each Tap (signal extraction portions 65-1 and 65-2).

With this configuration, since the light can be more reliably caused not to enter the Inactive Tap, as a result, the transfer efficiency can be further increased.

Note that, in the configuration of FIG. 21, compared to the configuration of FIG. 20, although an amount of light entering the substrate 61 decreases, a constant signal level can be secured by enhancement of the converging ability of the on-chip lens 62, or amplification of the pixel signal in the peripheral circuit unit.

Exit Pupil Correction

In the pixel array unit 21, it is necessary to increase an exit pupil correction amount of the on-chip lens 62 from the center toward the periphery.

At this time, the exit pupil correction amount of the on-chip lens 62 is optimally adjusted, whereby the photoelectric conversion in the vicinity of the inactive Tap may be suppressed and the current flowing into the Inactive Tap may be reduced.

Figure 22:
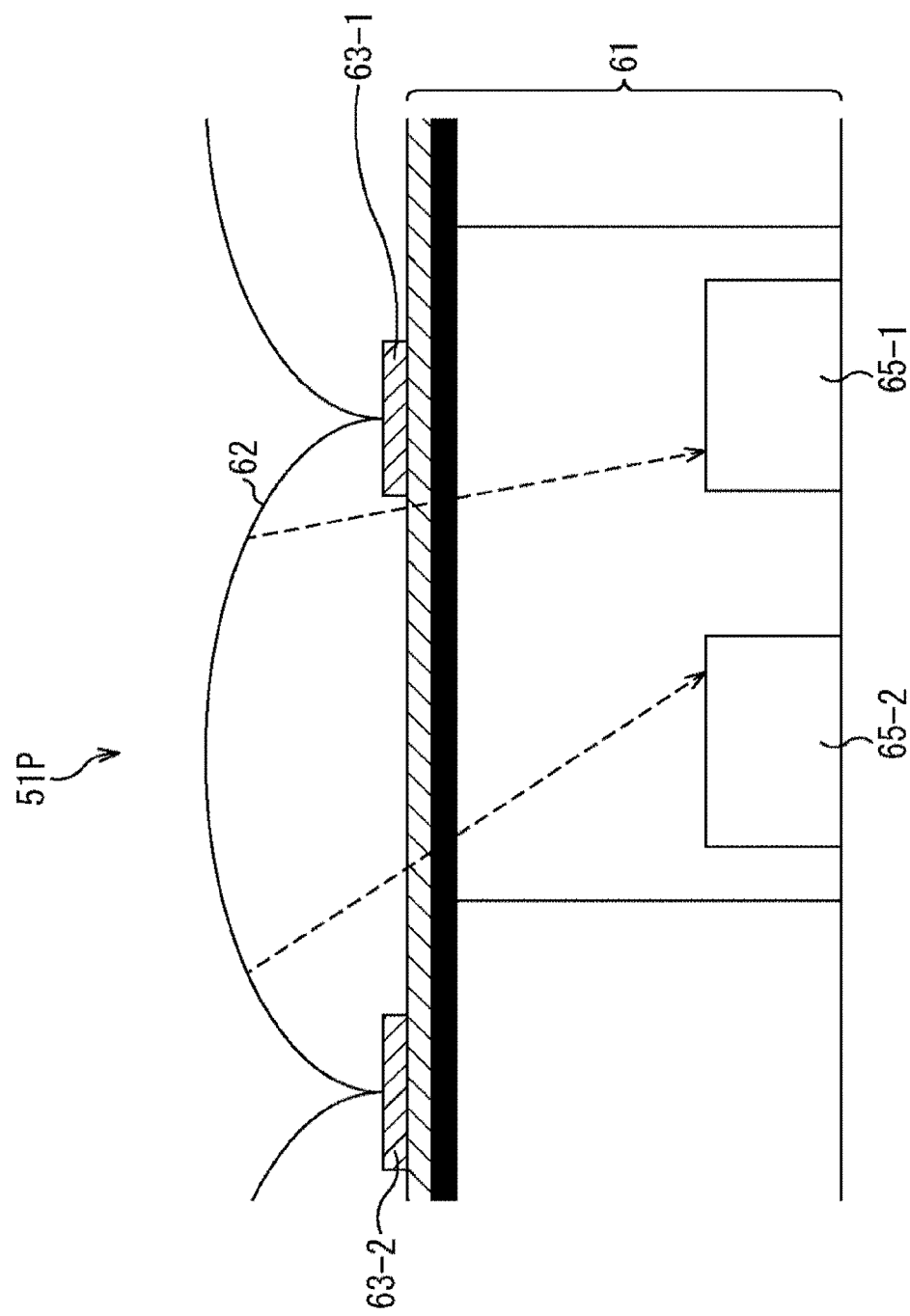
FIG. 22 is a diagram illustrating another configuration example of the pixel.

FIG. 22 illustrates a configuration example of a pixel 51p arranged at an end portion of the pixel array unit 21.

As illustrated in FIG. 22, the exit pupil correction amount of the on-chip lens 62 is adjusted with respect to the pixel 51P, whereby the light having entered the on-chip lens 62 from the outside is converged between the signal extraction portion 65-1 and the signal extraction portion 65-2.

With this configuration, also in the pixel arranged at the end portion of the pixel array unit 21, the photoelectric conversion in the vicinity of the Inactive Tap is suppressed, and the current flowing into the Inactive Tap can be reduced, so that the transfer efficiency can be increased.

Reflection Member

To improve sensitivity of the pixel 51, a reflection member having a large area may be provided on a surface on the opposite side of the substrate 61 from the incident surface.

Figure 23:
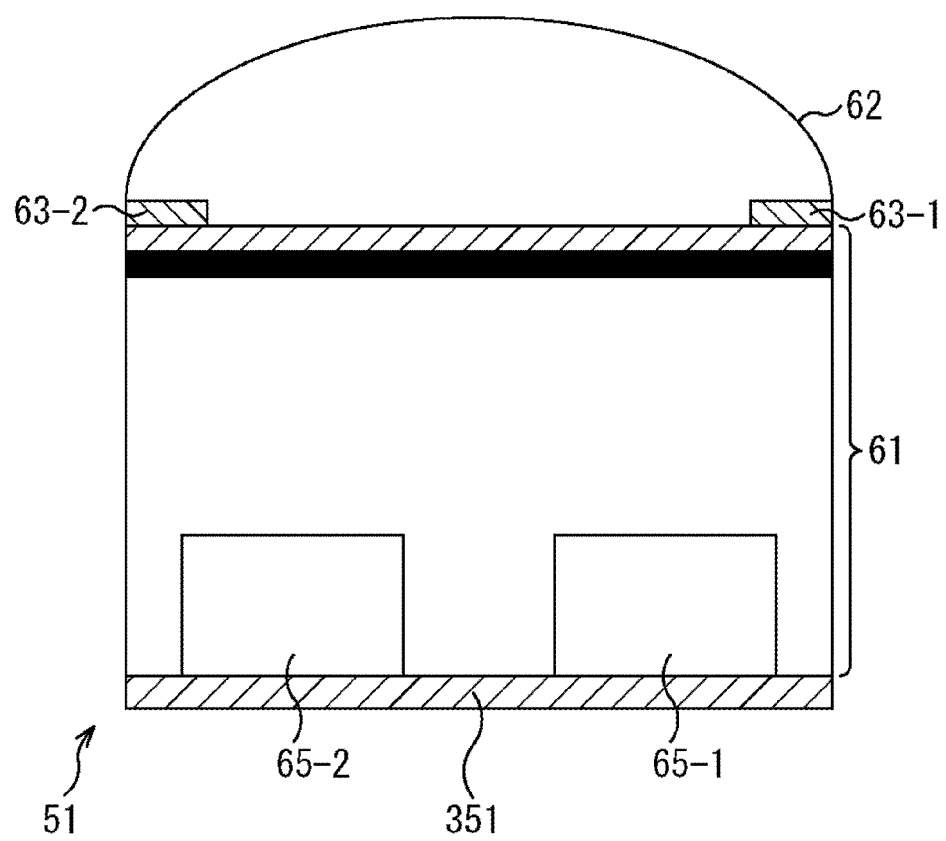
FIG. 23 is a diagram illustrating another configuration example of the pixel.

FIG. 23 illustrates another configuration example of the pixel 51.

In the pixel 51 in FIG. 23, in addition to the configuration similar to the pixel 51 in FIG. 2, a reflection member 351 that reflects infrared light is provided to cover the entire surface on the opposite side of the substrate 61 from the incident surface.

As the reflection member 351, any reflection member may be used as long as the reflection member has high reflectance of infrared light. For example, a metal may be used as the reflection member 351, such as copper or aluminum provided in a multilayer wiring layer layered on the surface on the opposite side of the substrate 61 from the incident surface. Furthermore, as the reflection member 351, a reflecting structure such as polysilicon or an oxide film may be formed on the surface on the opposite side of the substrate 61 from the incident surface.

With such a configuration, the infrared light having entered in the substrate 61 from the incident surface via the on-chip lens 62 and transmitted through the substrate 61 without being subjected to the photoelectric conversion in the substrate 61, can be reflected by the reflection member 351 and again caused to enter the substrate 61. As a result, an amount of infrared light subjected to the photoelectric conversion in the substrate 61 can be increased, and the quantum efficiency and hence the pixel sensitivity can be improved.

6. Second Embodiment

Figure 24:
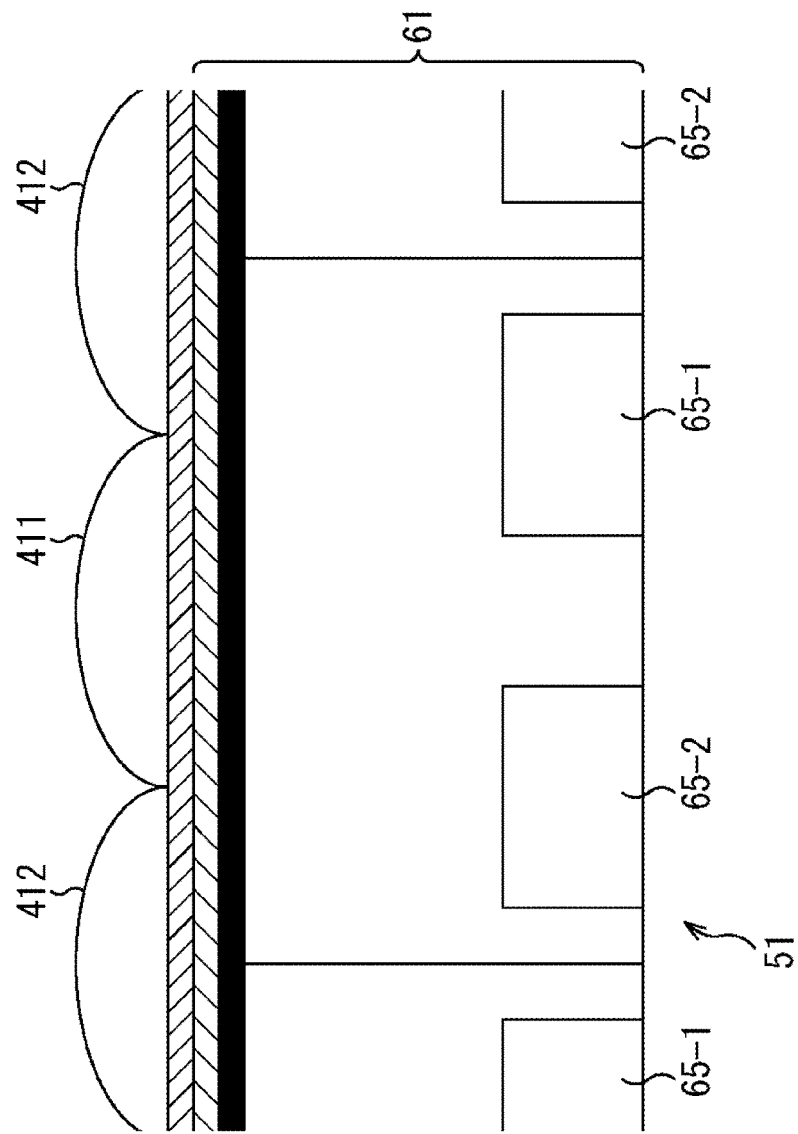
FIG. 24 is a diagram illustrating a configuration example of a pixel of a second embodiment.
Figure 25:
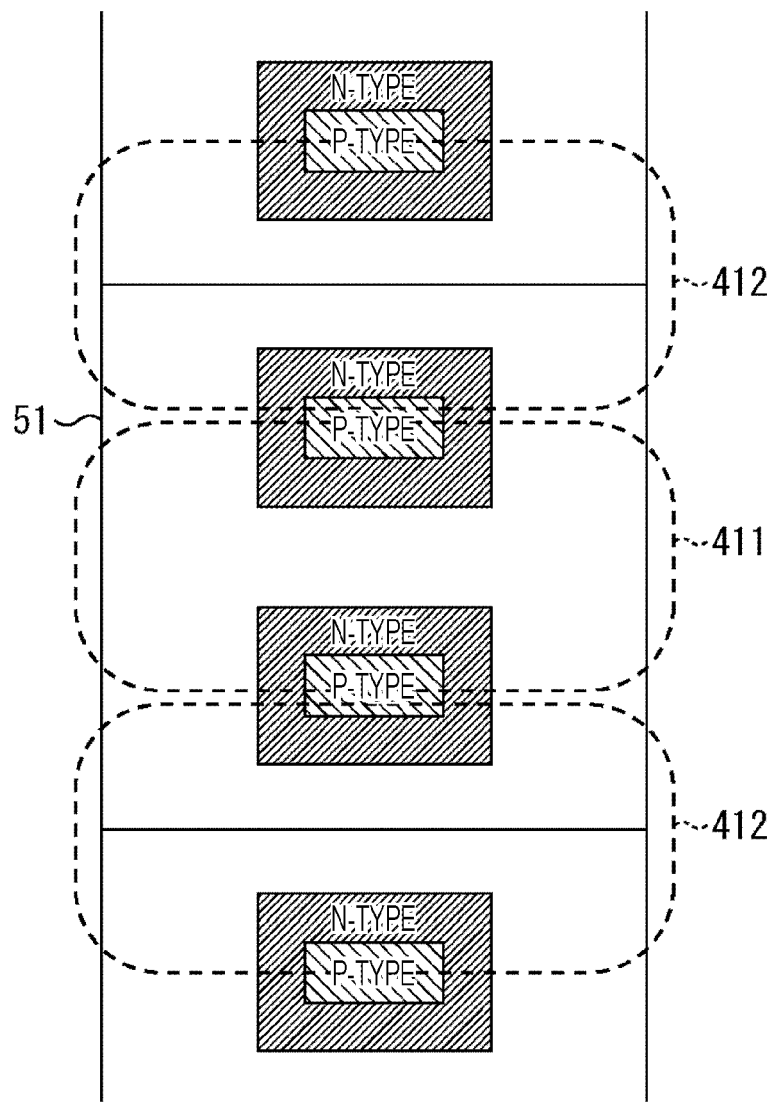
FIG. 25 is a diagram illustrating a configuration example of the pixel of the second embodiment.

FIGS. 24 and 25 are diagrams each illustrating a configuration example of a pixel of a second embodiment to which the present technology is applied.

FIG. 24 illustrates a cross-sectional view of the pixel 51 provided in the pixel array unit 21, and FIG. 25 illustrates a plan view of the pixel 51.

The pixel 51 of the present embodiment includes the substrate 61 and on-chip lenses 411 and 412 each having an upwardly convex curved surface shape as the converging portion formed on the substrate 61.

The on-chip lens 411 is formed to be laid across the signal extraction portion 65-1 and the signal extraction portion 65-2 at a central portion of the pixel 51 on the incident surface of the substrate 61.

Between the pixel 51 on the incident surface of the substrate 61 and a pixel (adjacent pixel) adjacent to the pixel 51, the on-chip lens 412 is formed to be laid across the signal extraction portion 65-1 and the signal extraction portion 65-2 (the signal extraction portion 65-2 and the signal extraction portion 65-1) of the respective adjacent pixels.

Etch back is performed on STSR that is an organic material, whereby both the on-chip lenses 411 and 412 are formed.

Figure 26:
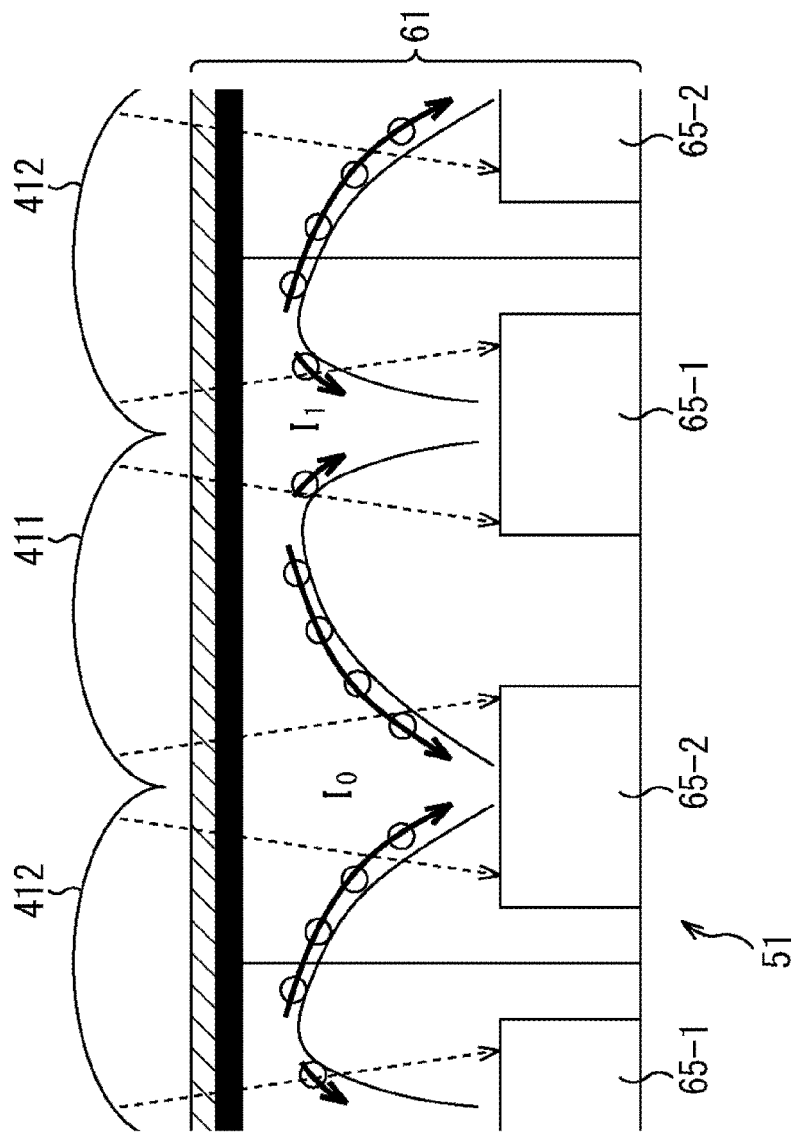
FIG. 26 is a diagram for explaining transfer efficiency.

With the on-chip lens 411, as illustrated in FIG. 26, infrared light having entered the on-chip lens 411 from the outside is converged at the vicinity of the center of the pixel 51 in the substrate 61, specifically, between the signal extraction portion 65-1 and the signal extraction portion 65-2.

As a result, photoelectric conversion in the vicinity of the signal extraction portion 65-1 is suppressed, and the current $I_1$ flowing into the Inactive Tap (signal extraction portion 65-1) can be reduced.

Furthermore, with the on-chip lens 412, as illustrated in FIG. 26, infrared light having entered the on-chip lens 412 from the outside is converged between the signal extraction portion 65-1 (65-2) of the pixel 51 and the signal extraction portion 65-2 (65-1) of the adjacent pixel.

As a result, signal charges are generated by photoelectric conversion at a boundary portion between adjacent pixels in the substrate 61, and a current corresponding to the signal charges flows into the Active Tap (signal extraction portion 65-2).

With the above configuration, the current flowing into the Inactive Tap can be reduced, so that the transfer efficiency can be increased. Moreover, with the above configuration, an amount of light subjected to photoelectric conversion in the substrate 61 can be increased, so that the pixel sensitivity can be improved.

Note that, as the converging portion included in the pixel 51 of the present embodiment, the configurations described with reference to FIGS. 6 to 14 may be applied instead of the on-chip lenses 411 and 412.

7. Applicable CAPD Sensor

In the above description, an example has been described in which the present technology is applied to the back-illuminated CAPD sensor; however, the present technology can also be applied to a front-illuminated CAPD sensor.

Figure 27:
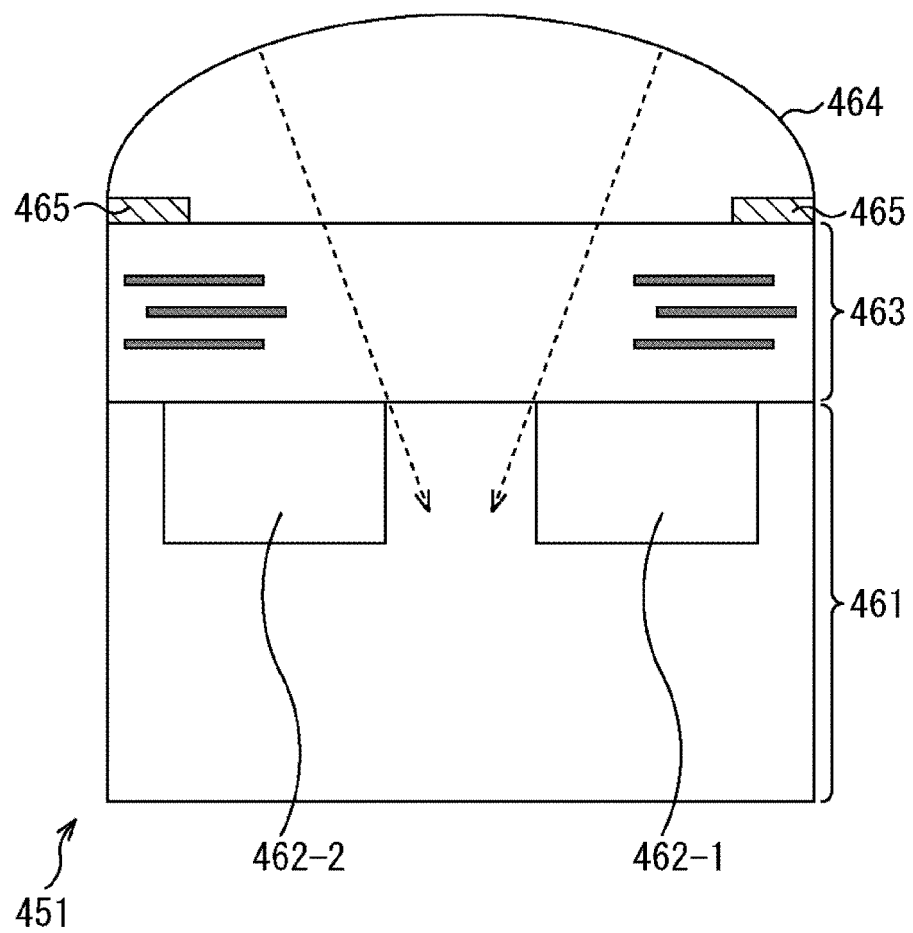
FIG. 27 is a diagram illustrating another configuration example of the pixel.

FIG. 27 is a diagram illustrating a configuration example of a pixel included in the front-illuminated CAPD sensor.

As illustrated in FIG. 27, in a pixel 451 included in the front-illuminated CAPD sensor, a substrate 461 receives incident light entering from a front surface (upper surface) side of the substrate. Signal extraction portions 462-1 and 462-2 are formed in an incident surface side in the substrate 461, in other words, a portion inside the upper surface in the figure.

On the substrate 461, a wiring layer 463 is provided. The wiring layer 463 is a so-called multilayer wiring layer, and is formed including a wiring line, and an interlayer insulating film constituting an insulating layer alternately layered plural times.

On the wiring layer 463, an on-chip lens 464 having an upwardly convex curved surface shape is formed as the converging portion that converges light having entered from the outside and causes the light to enter in the substrate 461. Etch back is performed on STSR that is an organic material, whereby the on-chip lens 464 is formed; however, the configurations described with reference to FIGS. 6 to 14 may be applied instead of the on-chip lens 464.

Furthermore, in the pixel 451, at an end portion of the pixel 451 on the incident surface of the substrate 461, an inter-pixel light shielding portion 465 is formed for preventing color mixing between adjacent pixels.

As described above, in the front-illuminated CAPD sensor, a photoelectric conversion region is limited by the wiring line or the like arranged on the incident surface side of the light. However, even with such a configuration, the on-chip lens 464 converges the light between the signal extraction portion 462-1 and the signal extraction portion 462-2, whereby the transfer efficiency can be increased, so that the distance measurement error can be reduced.

8. Configuration Example of Imaging Device

The solid-state imaging element 11 can be applied to various electronic devices such as an imaging device such as a digital still camera or a digital video camera, a mobile phone having an imaging function, and another device having an imaging function, for example.

Figure 28:
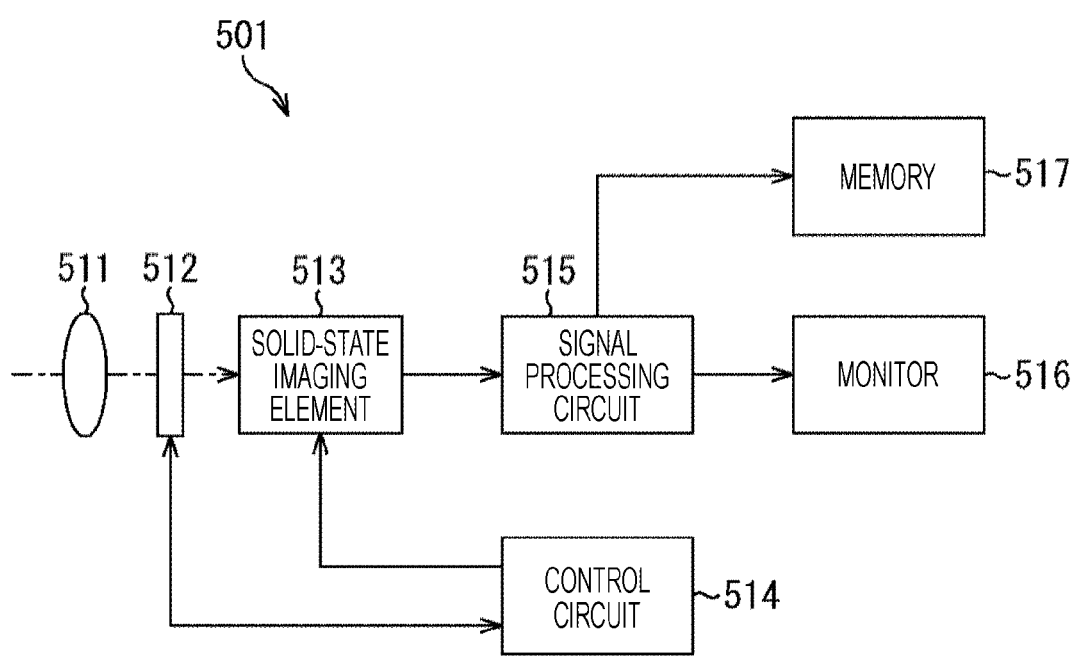
FIG. 28 is a diagram illustrating a configuration example of an imaging device.

FIG. 28 is a block diagram illustrating a configuration example of an imaging device as an electronic device to which the present technology is applied.

An imaging device 501 illustrated in FIG. 28 includes an optical system 511, a shutter device 512, a solid-state imaging element 513, a control circuit 514, a signal processing circuit 515, a monitor 516, and a memory 517, and is enabled to capture a still image and a moving image.

The optical system 511 includes one or a plurality of lenses, and guides light (incident light) from a subject to the solid-state imaging element 513 to form an image on a light receiving surface of the solid-state imaging element 513.

The shutter device 512 is arranged between the optical system 511 and the solid-state imaging element 513, and controls a light irradiation period and a light shielding period to the solid-state imaging element 513 under the control of the control circuit 514.

The solid-state imaging element 513 accumulates signal charges for a certain period depending on the light focused on the light receiving surface via the optical system 511 and the shutter device 512. The signal charges accumulated in the solid-state imaging element 513 are transferred in accordance with a drive signal (timing signal) supplied from the control circuit 514.

The control circuit 514 outputs drive signals that control transfer operation of the solid-state imaging element 513 and shutter operation of the shutter device 512 to drive the solid-state imagine element 513 and the shutter device 512.

The signal processing circuit 515 performs various types of signal processing on the signal charges output from the solid-state imaging element 513. An image (image data) obtained by performing signal processing by the signal processing circuit 515 is supplied to the monitor 516 to be displayed, or supplied to the memory 517 to be recorded.

The present technology can also be applied to the imaging device 501 configured as described above. In other words, the solid-state imaging element 11 described above can be used as the solid-state imaging element 513.

9. Application Example to Mobile Body

The present technology can be applied to various products. The present technology may be implemented as a device mounted on any type of mobile body, for example, a car, an electric car, a hybrid electric car, a motorcycle, a bicycle, a personal mobility, an airplane, a drone, a ship, a robot, or the like.

Figure 29:
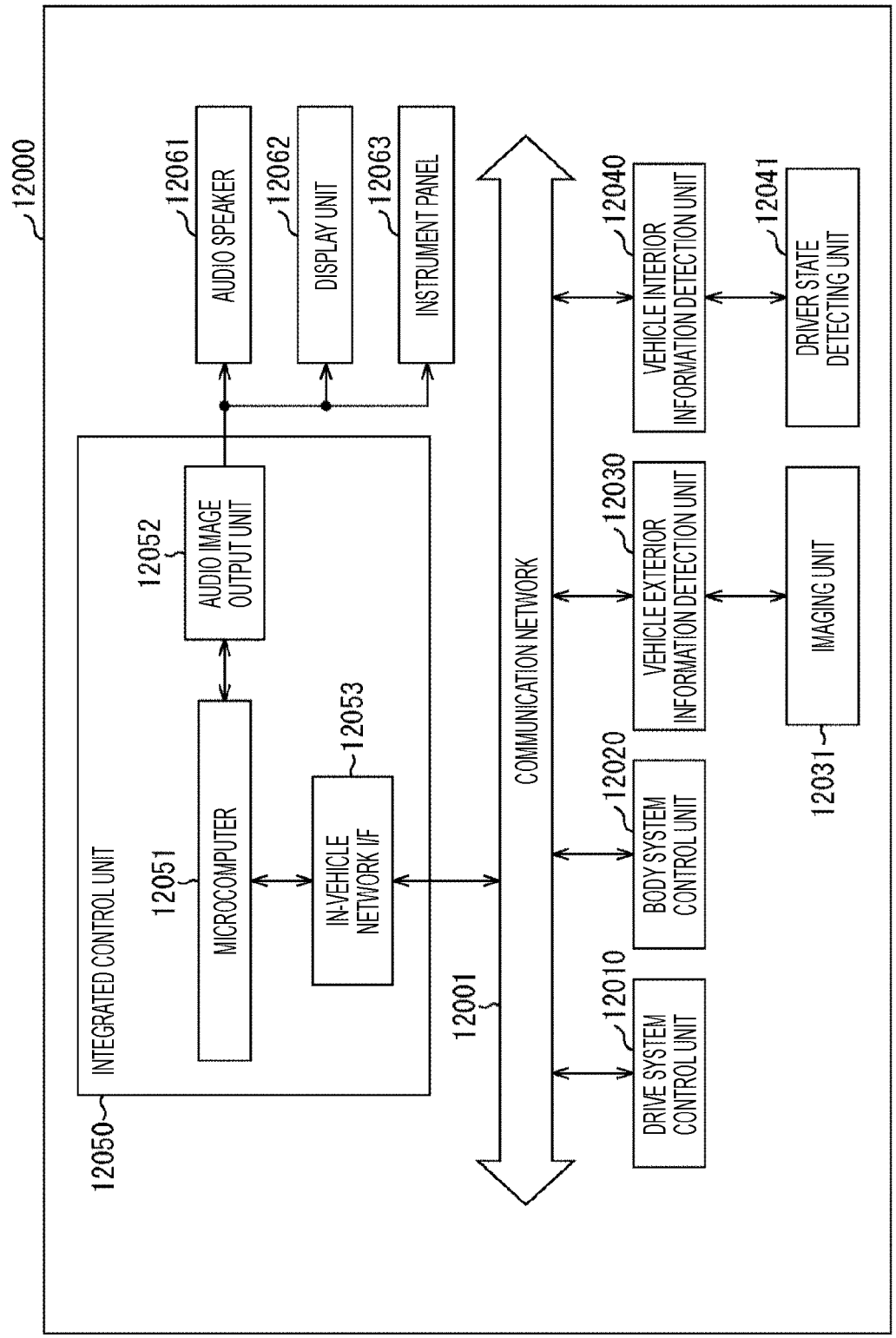
FIG. 29 is a block diagram illustrating an example of a schematic configuration of a vehicle control system.

FIG. 29 is a block diagram illustrating a schematic configuration example of a vehicle control system that is an example of a mobile body control system to which the technology according to the present disclosure can be applied.

The vehicle control system 12000 includes a plurality of electronic control units connected to each other via a communication network 12001. In the example illustrated in FIG. 29, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, an audio image output unit 12052, and an in-vehicle network interface (I/F) 12053 are illustrated.

The drive system control unit 12010 controls operation of devices related to a drive system of a vehicle in accordance with various programs. For example, the drive system control unit 12010 functions as a control device of a driving force generating device for generating driving force of the vehicle, such as an internal combustion engine or a driving motor, a driving force transmitting mechanism for transmitting driving force to wheels, a steering mechanism for adjusting a steering angle of the vehicle, a braking device for generating braking force of the vehicle, and the like.

The body system control unit 12020 controls operation of various devices equipped on the vehicle body in accordance with various programs. For example, the body system control unit 12020 functions as a control device of a keyless entry system, a smart key system, a power window device, or various lamps such as a head lamp, a back lamp, a brake lamp, a turn signal lamp, and a fog lamp. In this case, to the body system control unit 12020, a radio wave transmitted from a portable device that substitutes for a key, or signals of various switches can be input. The body system control unit 12020 accepts input of these radio waves or signals and controls a door lock device, power window device, lamp, and the like of the vehicle.

The vehicle exterior information detection unit 12030 detects information on the outside of the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image outside the vehicle and receives the image captured. The vehicle exterior information detection unit 12030 may perform object detection processing or distance detection processing on a person, a car, an obstacle, a sign, a character on a road surface, or the like, on the basis of the received image.

The imaging unit 12031 is an optical sensor that receives light and outputs an electric signal corresponding to an amount of light received. The imaging unit 12031 can output the electric signal as an image, or as distance measurement information. Furthermore, the light received by the imaging unit 12031 may be visible light, or invisible light such as infrared rays.

The vehicle interior information detection unit 12040 detects information on the inside of the vehicle. The vehicle interior information detection unit 12040 is connected to, for example, a driver state detecting unit 12041 that detects a state of a driver. The driver state detecting unit 12041 includes, for example, a camera that captures an image of the driver, and the vehicle interior information detection unit 12040 may calculate a degree of fatigue or a degree of concentration of the driver, or determine whether or not the driver is dozing, on the basis of the detection information input from the driver state detecting unit 12041.

The microcomputer 12051 can calculate a control target value of the driving force generating device, the steering mechanism, or the braking device on the basis of the information on the inside and outside of the vehicle acquired by the vehicle exterior information detection unit 12030 or the vehicle interior information detection unit 12040, and output a control command to the drive system control unit 12010. For example, the microcomputer 12051 can perform cooperative control aiming for implementing functions of advanced driver assistance system (ADAS) including collision avoidance or shock mitigation of the vehicle, follow-up traveling based on an inter-vehicle distance, vehicle speed maintaining traveling, vehicle collision warning, vehicle lane departure warning, or the like.

Furthermore, the microcomputer 12051 can perform cooperative control aiming for automatic driving that autonomously travels without depending on operation of the driver, or the like, by controlling the driving force generating device, the steering mechanism, the braking device, or the like on the basis of information on the periphery of the vehicle acquired by the vehicle exterior information detection unit 12030 or the vehicle interior information detection unit 12040.

Furthermore, the microcomputer 12051 can output a control command to the body system control unit 12020 on the basis of information on the outside of the vehicle acquired by the vehicle exterior information detection unit 12030. For example, the microcomputer 12051 can perform cooperative control aiming for preventing dazzling such as switching from the high beam to the low beam, by controlling the head lamp depending on a position of a preceding vehicle or an oncoming vehicle detected by the vehicle exterior information detection unit 12030.

The audio image output unit 12052 transmits at least one of audio and image output signals to an output device capable of visually or aurally notifying an occupant in the vehicle or the outside of the vehicle of information. In the example of FIG. 29, as the output device, an audio speaker 12061, a display unit 12062, and an instrument panel 12063 are illustrated. The display unit 12062 may include, for example, at least one of an on-board display or a head-up display.

Figure 30:
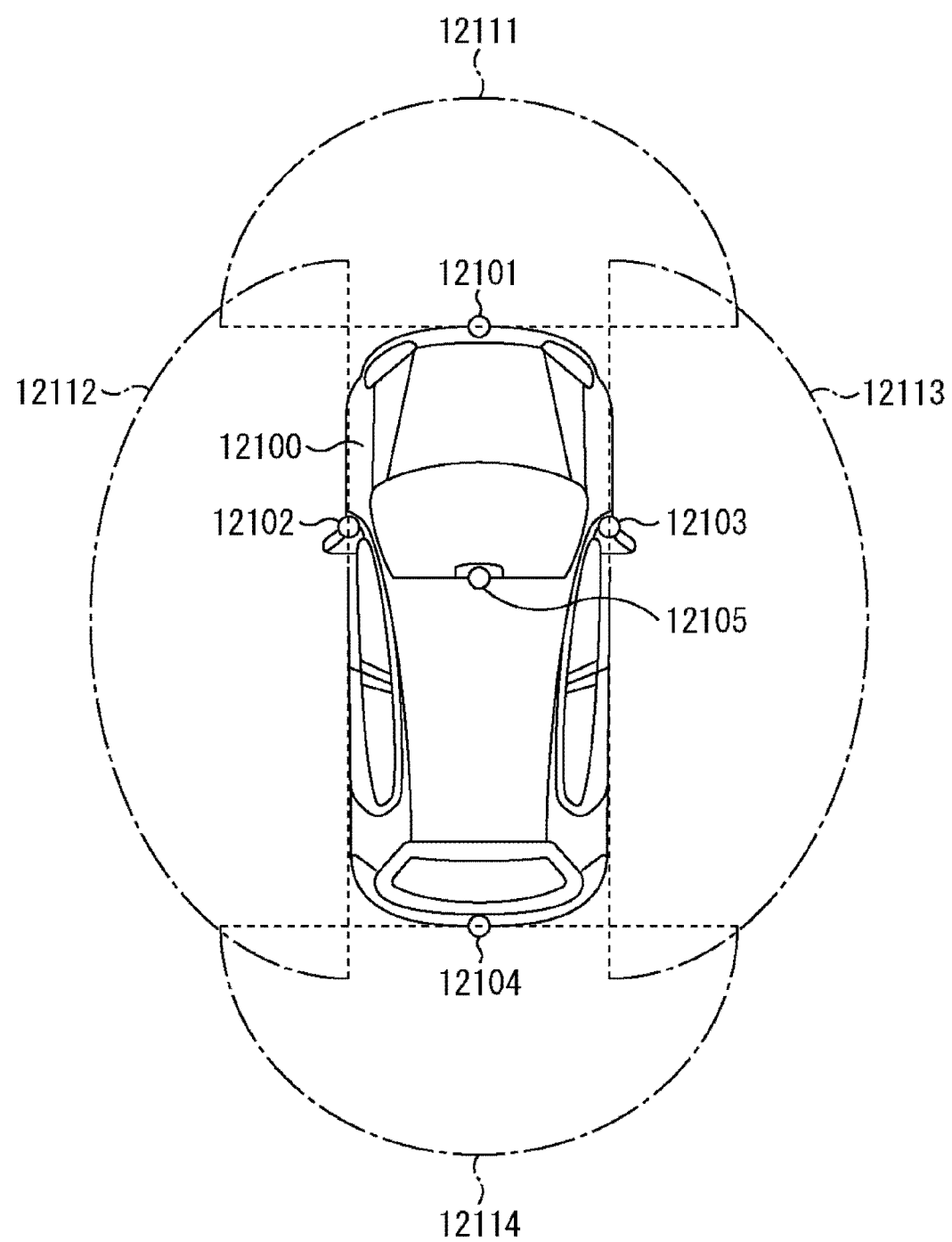
FIG. 30 is an explanatory diagram illustrating an example of installation positions of a vehicle exterior information detecting unit and an imaging unit.

FIG. 30 is a diagram illustrating an example of installation positions of the imaging unit 12031.

In FIG. 30, as the imaging unit 12031, imaging units 12101, 12102, 12103, 12104, and 12105 are included.

Imaging units 12101, 12102, 12103, 12104, and 12105 are provided at, for example, at a position of the front nose, the side mirror, the rear bumper, the back door, the upper part of the windshield in the vehicle interior, or the like, of a vehicle 12100. The imaging unit 12101 provided at the front nose and the imaging unit 12105 provided at the upper part of the windshield in the vehicle interior mainly acquire images ahead of the vehicle 12100. The imaging units 12102 and 12103 provided at the side mirrors mainly acquire images on the sides of the vehicle 12100. The imaging unit 12104 provided at the rear bumper or the back door mainly acquires an image behind the vehicle 12100. The imaging unit 12105 provided on the upper part of the windshield in the vehicle interior is mainly used for detecting a preceding vehicle, a pedestrian, an obstacle, a traffic signal, a traffic sign, a lane, or the like.

Note that, FIG. 30 illustrates an example of imaging ranges of the imaging units 12101 to 12104. An imaging range 12111 indicates an imaging range of the imaging unit 12101 provided at the front nose, imaging ranges 12112 and 12113 respectively indicate imaging ranges of the imaging units 12102 and 12103 provided at the side mirrors, an imaging range 12114 indicates an imaging range of the imaging unit 12104 provided at the rear bumper or the back door. For example, image data captured by the imaging units 12101 to 12104 are superimposed on each other, whereby an overhead image is obtained of the vehicle 12100 viewed from above.

At least one of the imaging units 12101 to 12104 may have a function of acquiring distance information. For example, at least one of the imaging units 12101 to 12104 may be a stereo camera including a plurality of imaging elements, or may be an imaging element including pixels for phase difference detection.

For example, on the basis of the distance information obtained from the imaging units 12101 to 12104, the microcomputer 12051 obtains a distance to each three-dimensional object within the imaging ranges 12111 to 12114, and a temporal change of the distance (relative speed to the vehicle 12100), thereby being able to extract, as a preceding vehicle, a three-dimensional object that is in particular a closest three-dimensional object on a traveling path of the vehicle 12100 and traveling at a predetermined speed (for example, greater than or equal to 0 km/h) in substantially the same direction as that of the vehicle 12100. Moreover, the microcomputer 12051 can set an inter-vehicle distance to be secured in advance in front of the preceding vehicle, and can perform automatic brake control (including follow-up stop control), automatic acceleration control (including follow-up start control), and the like. As described above, it is possible to perform cooperative control aiming for automatic driving that autonomously travels without depending on operation of the driver, or the like.

For example, on the basis of the distance information obtained from the imaging units 12101 to 12104, the microcomputer 12051 can extract three-dimensional object data regarding the three-dimensional object by classifying the objects into a two-wheeled vehicle, a regular vehicle, a large vehicle, a pedestrian, and other three-dimensional objects such as a utility pole, and use the data for automatic avoidance of obstacles. For example, the microcomputer 12051 identifies obstacles in the periphery of the vehicle 12100 into an obstacle visually recognizable to the driver of the vehicle 12100 and an obstacle difficult to be visually recognized. Then, the microcomputer 12051 determines a collision risk indicating a risk of collision with each obstacle, and when the collision risk is greater than or equal to a set value and there is a possibility of collision, the microcomputer 12051 outputs an alarm to the driver via the audio speaker 12061 and the display unit 12062, or performs forced deceleration or avoidance steering via the drive system control unit 12010, thereby being able to perform driving assistance for collision avoidance.

At least one of the imaging units 12101 to 12104 may be an infrared camera that detects infrared rays. For example, the microcomputer 12051 can recognize a pedestrian by determining whether or not a pedestrian exists in the captured images of the imaging units 12101 to 12104. Such pedestrian recognition is performed by, for example, a procedure of extracting feature points in the captured images of the imaging units 12101 to 12104 as infrared cameras, and a procedure of performing pattern matching processing on a series of feature points indicating a contour of an object to determine whether or not the object is a pedestrian. When the microcomputer 12051 determines that a pedestrian exists in the captured images of the imaging units 12101 to 12104 and recognizes the pedestrian, the audio image output unit 12052 controls the display unit 12062 so that a rectangular contour line for emphasis is superimposed and displayed on the recognized pedestrian. Furthermore, the audio image output unit 12052 may control the display unit 12062 so that an icon or the like indicating the pedestrian is displayed at a desired position.

In the above, an example has been described of the vehicle control system to which the present technology can be applied. The present technology can be applied to the imaging unit 12031 (at least one of the imaging units 12101 to 12104) among the above-described configurations. Specifically, the solid-state imaging element 11 of FIG. 1 can be applied to the imaging unit 12031. By applying the present technology to the imaging unit 12031, in a case where the imaging unit 12031 has a function of acquiring distance information by the indirect ToF method, the distance measurement error can be reduced, so that safer automatic driving and driving assistance can be implemented.

Note that, the embodiment of the present technology is not limited to the embodiments described above, and various modifications are possible without departing from the scope of the present technology.

Moreover, the present technology can also adopt the following configurations.

(1)
An imaging element including:
a pixel array unit including a plurality of pixels that performs photoelectric conversion of light having entered, in which
each of the pixels includes:
a substrate that performs photoelectric conversion of the light having entered;
a first signal extraction portion including an application electrode to generate an electric field by application of a voltage and an attraction electrode to detect a signal carrier generated by photoelectric conversion;
a second signal extraction portion including the application electrode and the attraction electrode; and
a converging portion that is formed on the substrate and causes the light to enter the substrate, and
the converging portion converges the light at least between the first signal extraction portion and the second signal extraction portion provided in the substrate.

(2)
The imaging element according to (1), in which
the converging portion includes an on-chip lens having an upwardly convex curved surface shape.

(3)
The imaging element according to (2), in which
the on-chip lens is formed by etch back on STSR.

(4)
The imaging element according to (2), in which
the on-chip lens is formed by reflow processing.

(5)
The imaging element according to (2), in which
the on-chip lens is formed using a high refractive index material.

(6)
The imaging element according to (2), in which
the on-chip lens is formed by etching on a substrate material constituting the substrate.

(7)
The imaging element according to (2), further including an overcoat layer formed on the on-chip lens.

(8)
The imaging element according to (1), in which
the converging portion includes an on-chip lens having a downwardly convex curved surface shape.

(9)
The imaging element according to (1), in which
the converging portion includes a diffractive lens.

(10)
The imaging element according to (1), in which
the converging portion includes a gradient index lens.

(11)
The imaging element according to any of (1) to (10), further including
an in-layer lens formed between the converging portion and the substrate.

(12)
The imaging element according to any of (1) to (11), in which
each of the pixels further includes an inter-pixel light shielding portion formed at an end portion of each of the pixels on an incident surface of the substrate.

(13)
The imaging element according to (12), in which
the inter-pixel light shielding portion is formed to cover at least half of each of the first signal extraction portion and the second signal extraction portion.

(14)
The imaging element according to any of (1) to (13), in which
each of the pixels further includes a pixel separation portion formed to separate the substrate for each of the pixels.

(15)
The imaging element according to any of (1) to (14), in which
each of the pixels further includes a reflection member that is formed on a surface on an opposite side of the substrate from an incident surface and reflects the light having entered the substrate from the incident surface.

(16)
The imaging element according to any of (1) to (15), in which
the converging portion is formed one by one for each pixel, on the substrate.

(17)
The imaging element according to any of (1) to (10), in which
the converging portion includes
a first converging portion that converges the light between the first signal extraction portion and the second signal extraction portion of each of the pixels, and
a second converging portion that converges the light between the first signal extraction portion or the second signal extraction portion of each of the pixels, and the second signal extraction portion or the first signal extraction portion of an adjacent pixel adjacent to each of the pixels.

(18)
The imaging element according to any of (1) to (17), in which
the first signal extraction portion and the second signal extraction portion are provided on a surface side on an opposite side of the substrate from an incident surface.

(19)
The imaging element according to any of (1) to (10), in which
the first signal extraction portion and the second signal extraction portion are provided on an incident surface side of the substrate.

(20)
An imaging device including
an imaging element including
a pixel array unit including a plurality of pixels that performs photoelectric conversion of light having entered, in which
each of the pixels includes:
a substrate that performs photoelectric conversion of the light having entered;
a first signal extraction portion including an application electrode to generate an electric field by application of a voltage and an attraction electrode to detect a signal carrier generated by photoelectric conversion;
a second signal extraction portion including the application electrode and the attraction electrode; and
a converging portion that is formed on the substrate and causes the light to enter the substrate, and
the converging portion converges the light at least between the first signal extraction portion and the second signal extraction portion provided in the substrate.

REFERENCE SIGNS LIST

11 Solid-state imaging element
21 Pixel array unit
22 Pixel drive unit

51 Pixel
61 Substrate
62 On-chip lens
65-1, 65-2, 65 Signal extraction portion
71-1, 71-2, 71 N+ semiconductor region
73-1, 73-2, 73 P+ semiconductor region

What is claimed is:

1. An imaging element, comprising:
a pixel array unit including a plurality of pixels that performs photoelectric conversion of light having entered, wherein
each of the pixels includes:
a substrate that performs photoelectric conversion of the light having entered;
a first signal extraction portion including an application electrode to generate an electric field by application of a voltage and an attraction electrode to detect a signal carrier generated by photoelectric conversion;
a second signal extraction portion including the application electrode and the attraction electrode; and
a converging portion that is formed on the substrate and causes the light to enter the substrate,
wherein the converging portion converges the light at least between the first signal extraction portion and the second signal extraction portion provided in the substrate, and
wherein the converging portion includes:
a first converging portion that converges the light between the first signal extraction portion and the second signal extraction portion of each of the pixels, and
a second converging portion that converges the light between the first signal extraction portion or the second signal extraction portion of each of the pixels, and the second signal extraction portion or the first signal extraction portion of an adjacent pixel adjacent to each of the pixels.

2. The imaging element according to claim 1, wherein the converging portion includes an on-chip lens having an upwardly convex curved surface shape.

3. The imaging element according to claim 2, wherein the on-chip lens is formed by etch back on STSR.

4. The imaging element according to claim 2, wherein the on-chip lens is formed by reflow processing.

5. The imaging element according to claim 2, wherein the on-chip lens is formed using a high refractive index material.

6. The imaging element according to claim 2, wherein the on-chip lens is formed by etching on a substrate material constituting the substrate.

7. The imaging element according to claim 2, further comprising
an overcoat layer formed on the on-chip lens.

8. The imaging element according to claim 1, wherein the converging portion includes an on-chip lens having a downwardly convex curved surface shape.

9. The imaging element according to claim 1, wherein the converging portion includes a diffractive lens.

10. The imaging element according to claim 1, wherein the converging portion includes a gradient index lens.

11. The imaging element according to claim 1, wherein the first signal extraction portion and the second signal extraction portion are provided on a surface side on an opposite side of the substrate from an incident surface.

* * * * *